US012324234B2

(12) United States Patent
Xie et al.

(10) Patent No.: US 12,324,234 B2
(45) Date of Patent: Jun. 3, 2025

(54) FORK SHEET DEVICE WITH BETTER ELECTROSTATIC CONTROL

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 767 days.

(21) Appl. No.: 17/478,456

(22) Filed: Sep. 17, 2021

(65) Prior Publication Data
US 2023/0095140 A1    Mar. 30, 2023

(51) Int. Cl.
*H10D 84/85*    (2025.01)
*H10D 30/67*    (2025.01)
(Continued)

(52) U.S. Cl.
CPC ......... *H10D 84/85* (2025.01); *H10D 30/6728* (2025.01); *H10D 30/6733* (2025.01);
(Continued)

(58) Field of Classification Search
CPC ......... H01L 29/66545; H01L 21/76846; H01L 21/76849; H01L 29/7845; H01L 21/76834;
(Continued)

(56) References Cited

U.S. PATENT DOCUMENTS 9,196,613 B2    11/2015    Basker et al.
9,614,056 B2    4/2017    Xie et al.
(Continued)

FOREIGN PATENT DOCUMENTS

CN    104137264 A    11/2014
CN    104040705 B    11/2016
(Continued)

OTHER PUBLICATIONS

Weckx, P., et al., "Novel forksheet device architecture as ultimate logic scaling device towards 2nm", 2019 IEEE International Electron Devices Meeting (IEDM), Date of Conference: Dec. 7-11, 2019, pp. 36.5.1 to 36.5.4.
(Continued)

*Primary Examiner* — Moin M Rahman
(74) *Attorney, Agent, or Firm* — Scully, Scott, Murphy & Presser, P.C.; Samuel Waldbaum

(57) ABSTRACT

A semiconductor structure is provided having improved electrostatic contact close to the dielectric pillar that separates a first device region from a second device region. The semiconductor structure includes a dielectric pillar located between a first vertical nanosheet stack of suspended semiconductor channel material nanosheets and a second vertical nanosheet stack of suspended semiconductor channel material nanosheets. Horizontal dielectric bridge structures can be located in the first and second device regions. The horizontal bridge structures connect each of the suspended semiconductor channel material nanosheets to a respective sidewall of the dielectric pillar. A dielectric spacer structure can laterally surround a lower portion of the dielectric pillar and be present in a semiconductor substrate. In some embodiments, the horizontal dielectric bridge structures can be omitted.

12 Claims, 24 Drawing Sheets

(51) Int. Cl.
*H10D 62/10* (2025.01)
*H10D 89/60* (2025.01)
*H01L 21/762* (2006.01)

(52) U.S. Cl.
CPC ....... *H10D 30/6735* (2025.01); *H10D 62/118* (2025.01); *H10D 89/931* (2025.01); *H01L 21/76224* (2013.01)

(58) Field of Classification Search
CPC ......... H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/48; H01L 29/41775; H01L 29/42324; H01L 29/4234; H01L 21/31111; H01L 21/31155; H01L 29/40114; H01L 29/40117; H01L 29/7883; H01L 21/76831; H01L 21/76805; H01L 29/78; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22

See application file for complete search history.

(56) References Cited

U.S. PATENT DOCUMENTS

| | | | |
|---|---|---|---|
| 9,954,058 B1* | 4/2018 | Mochizuki | H10D 64/512 |
| 10,290,549 B2 | 5/2019 | Xie et al. | |
| 10,381,459 B2 | 8/2019 | Xie et al. | |
| 10,410,933 B2 | 9/2019 | Xie et al. | |
| 10,510,620 B1 | 12/2019 | Chanemougame et al. | |
| 10,734,523 B2 | 8/2020 | Lie et al. | |
| 10,804,165 B2 | 10/2020 | Seo et al. | |
| 2019/0273143 A1* | 9/2019 | Leobandung | H01L 29/401 |
| 2019/0288117 A1 | 9/2019 | Xie et al. | |
| 2019/0326395 A1 | 10/2019 | Ando et al. | |
| 2020/0035786 A1 | 1/2020 | Xie et al. | |
| 2021/0082766 A1 | 3/2021 | Miura et al. | |
| 2022/0139914 A1 | 5/2022 | Cheng et al. | |

FOREIGN PATENT DOCUMENTS

| | | |
|---|---|---|
| CN | 111755333 A | 10/2020 |
| KR | 20010021005 A | 3/2001 |

OTHER PUBLICATIONS

International Search Report and Written Opinion dated Mar. 13, 2023, received in a corresponding foreign application, 20 pages.
Invitation to Pay Additional Fees dated Jan. 17, 2023 received in a corresponding foreign application, 11 pages.

* cited by examiner

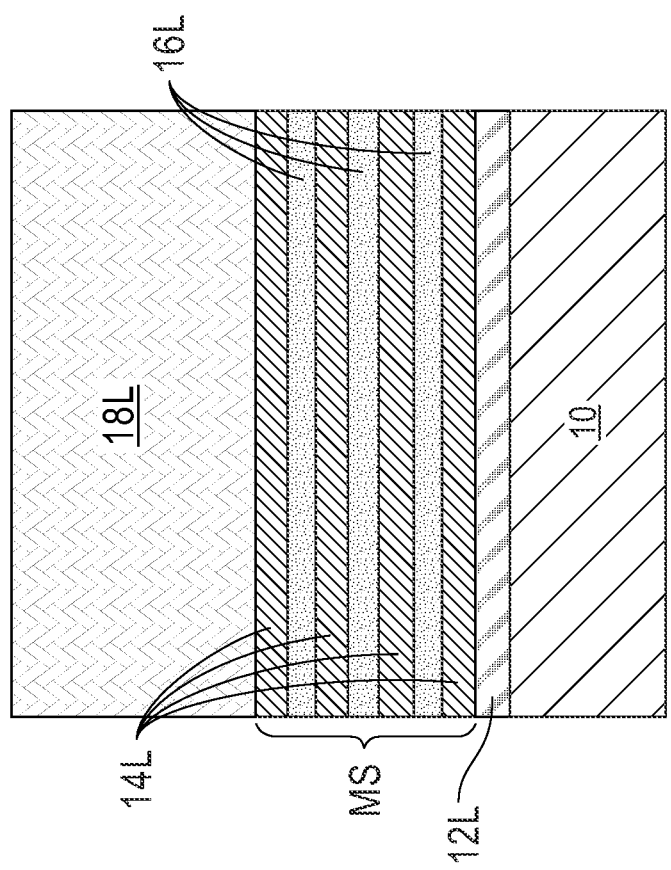
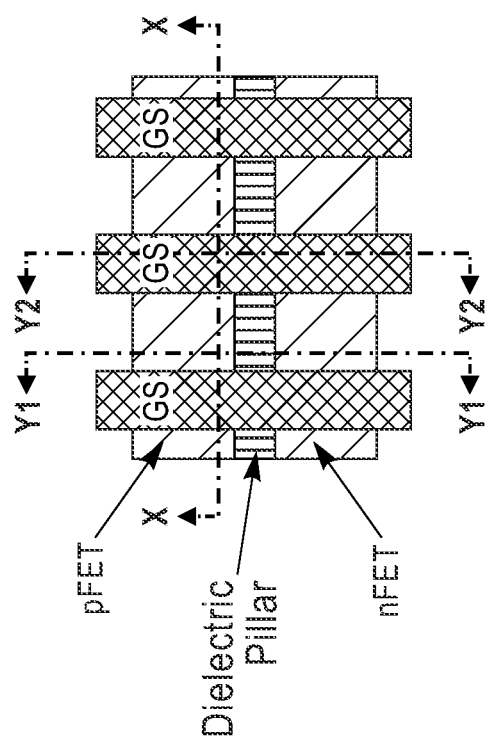
FIG. 2A
FIG. 1

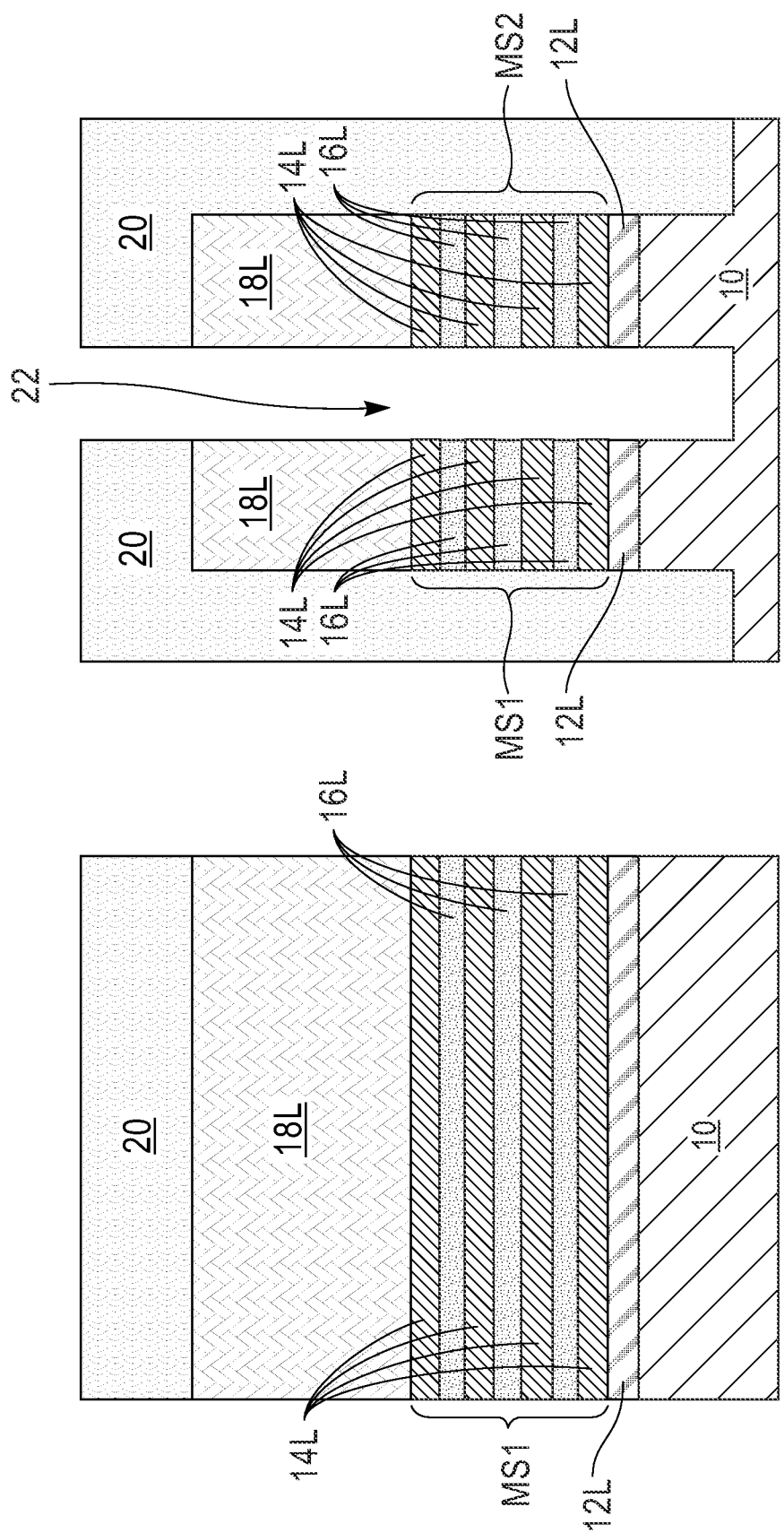

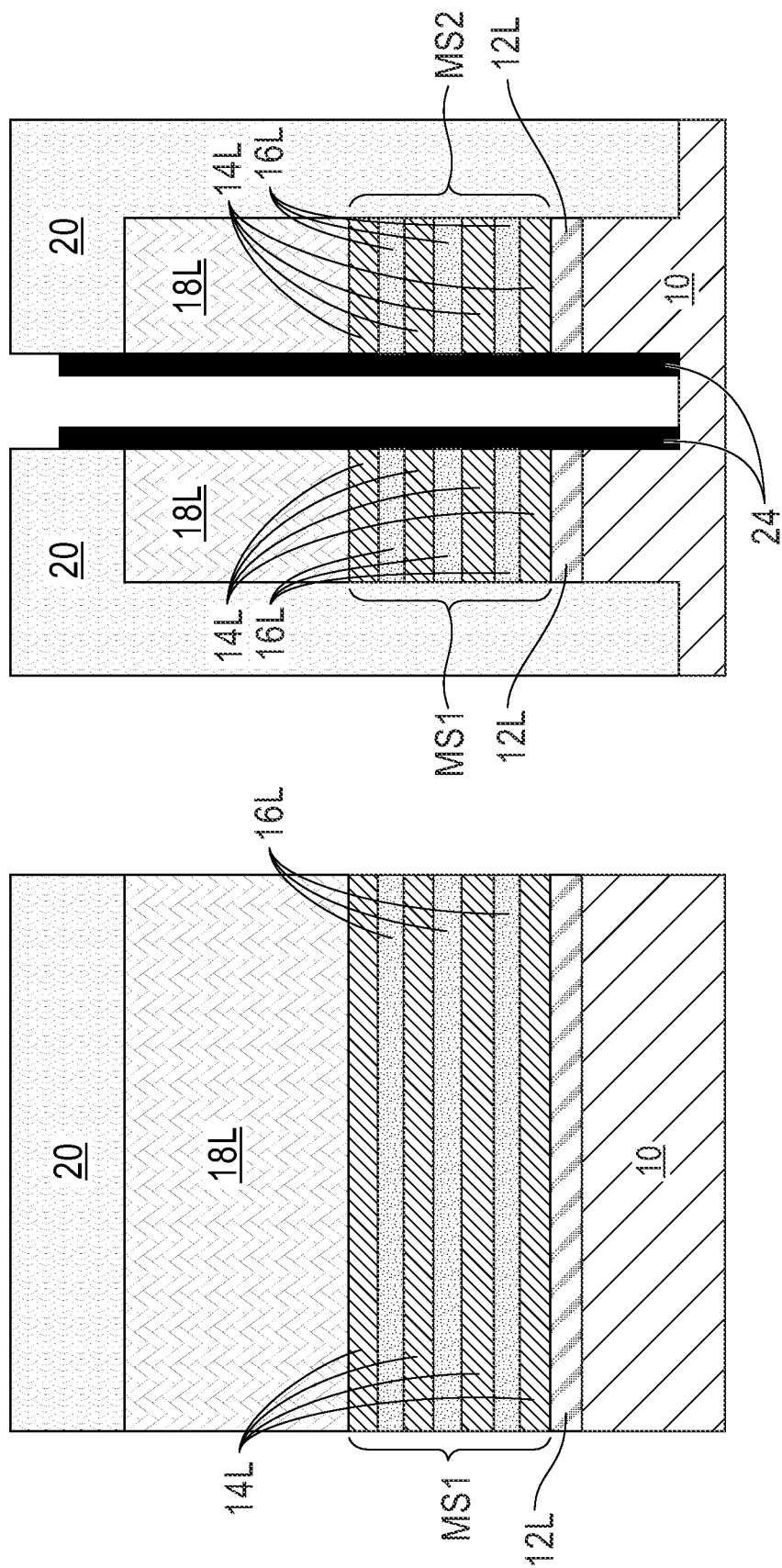

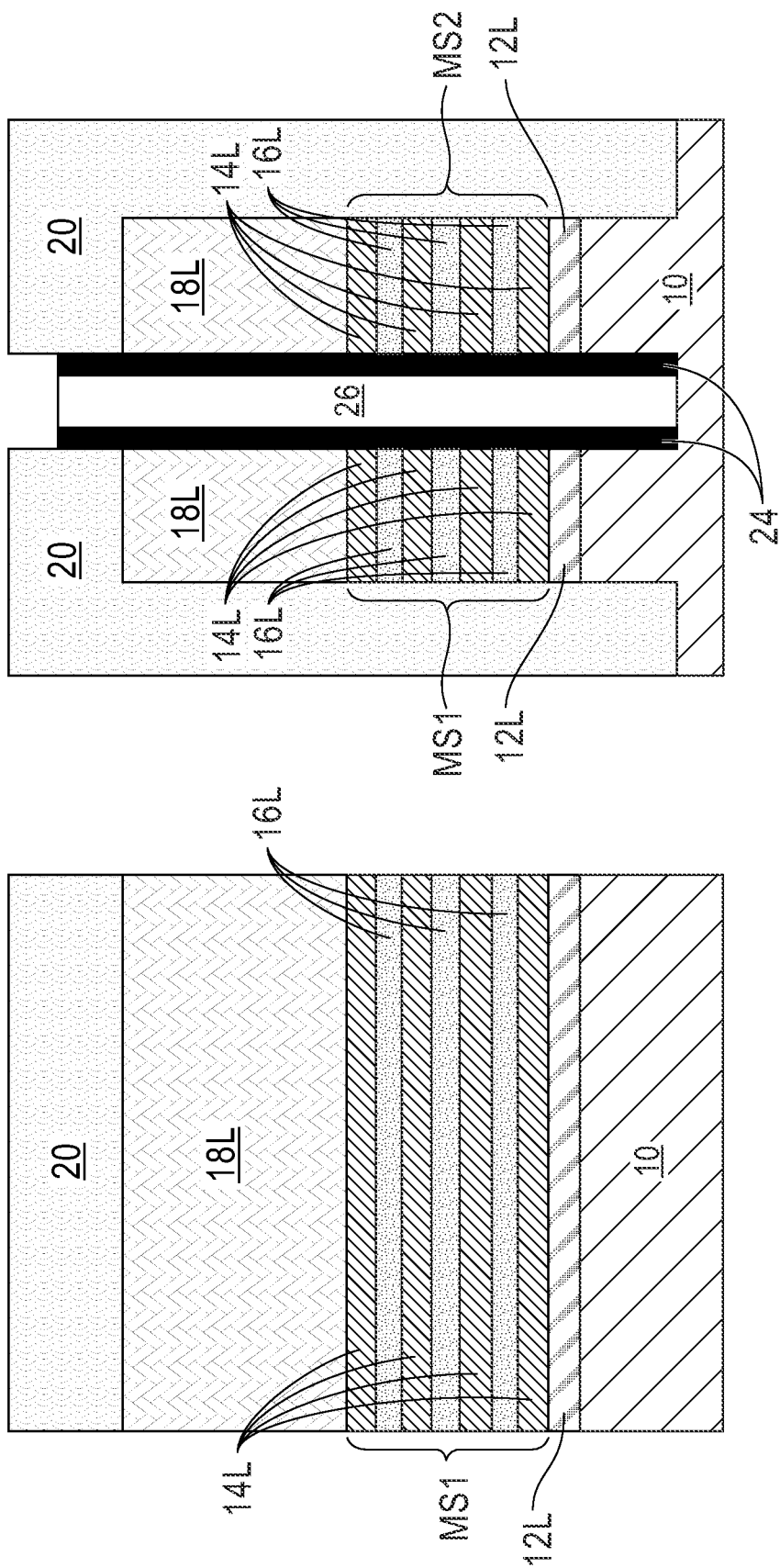

FORK SHEET DEVICE WITH BETTER ELECTROSTATIC CONTROL

BACKGROUND

The present application relates to semiconductor technology, and more particularly to a semiconductor structure in which electrostatic control close to a dielectric pillar separating two field effect transistors is improved.

Fork sheet devices have recently been proposed as a natural extension of vertically stacked lateral gate-all-around (GAA) nanosheet devices. Contrary to the GAA nanosheet device, in the fork sheet device, the nanosheets are now controlled by a tri-gate forked structure, realized by introducing a dielectric pillar (i.e., dielectric wall) attached to at least one of vertical edges of the nanosheets. The dielectric pillar can be formed between the pFET and nFET nanosheet devices. The dielectric pillar physically isolates the pFET nanosheet device region from the nFET nanosheet device region, allowing a much tighter n-to-p spacing. Alternatively, the dielectric pillar can also be formed at cell boundaries (i.e., between pFET and pFET nanosheet devices, or between nFET and nFET nanosheet devices) allowing a much tighter p-to-p or n-to-n spacing.

Because of this reduced n-to-p (or n-to-n, or p-to-p) separation, the fork sheet device has superior area and performance scalability as compared to FinFET or nanosheet structures. One problem with conventional fork sheet devices is that the electrostatic control close to the dielectric pillar is weaker compared to GAA structures, and this could result in poor gate control, especially at small gate lengths. There is thus a need for providing a fork sheet device that has improved electrostatic control close to the dielectric pillar that separates two nanosheet devices.

SUMMARY

A semiconductor structure is provided having improved electrostatic contact close to the dielectric pillar that separates a first device region from a second device region. The semiconductor structure includes a dielectric pillar located between a first vertical nanosheet stack of suspended semiconductor channel material nanosheets and a second vertical nanosheet stack of suspended semiconductor channel material nanosheets. Horizontal dielectric bridge structures can be located in the first and second device regions. The horizontal bridge structures connect each of the suspended semiconductor channel material nanosheets to a respective sidewall of the dielectric pillar. A dielectric spacer structure can laterally surround a lower portion of the dielectric pillar and be present in a semiconductor substrate. In some embodiments, the horizontal dielectric bridge structures can be omitted. The present application contemplates n-to-p, n-to-n, and p-to-p nanosheet devices.

In a first aspect of the present application, a semiconductor structure having improved electrostatic contact close to the dielectric pillar that separates a first device region (e.g., pFET device region) from a second device region (e.g., n-FET device region) is provided. In one embodiment of the present application, the semiconductor structure includes a first vertical nanosheet stack of suspended semiconductor channel material nanosheets located in a first device region, and a second vertical nanosheet stack of suspended semiconductor channel material nanosheets located in a second device region. The semiconductor structure further includes a dielectric pillar located between the first vertical nanosheet stack of suspended semiconductor channel material nanosheets and the second vertical nanosheet stack of suspended semiconductor channel material nanosheets. Horizontal dielectric bridge structures are located in the first device region, wherein each horizontal bridge structure in the first device region has a first end contacting a first sidewall of the dielectric pillar and a second end, opposite the first end, and contacting a sidewall of one of the suspended semiconductor channel material nanosheets of the first vertical nanosheet stack. The structure even further includes horizontal dielectric bridge structures located in the second device region, wherein each horizontal bridge structure in the second device region has a first end contacting a second sidewall, opposite the first sidewall, of the dielectric pillar and a second end, opposite the first end, and contacting a sidewall of one of the suspended semiconductor channel material nanosheets of the second vertical nanosheet stack.

In another embodiment of the present application, the semiconductor structure includes a first vertical nanosheet stack of suspended semiconductor channel material nanosheets located in a first device region, and a second vertical nanosheet stack of suspended semiconductor channel material nanosheets located in a second device region. The structure further includes a dielectric pillar located between the first vertical nanosheet stack of suspended semiconductor channel material nanosheets and the second vertical nanosheet stack of suspended semiconductor channel material nanosheets, and a dielectric spacer structure laterally surrounding a lower portion of the dielectric pillar and present in a semiconductor substrate.

In a second aspect of the present application, a method of forming a semiconductor structure having improved electrostatic contact close to the dielectric pillar that separates a pFET device region from an nFET device region is provided. The method of the present application will be apparent from the following detail description.

BRIEF DESCRIPTION OF THE DRAWINGS

FIG. 1 is a top down view illustrating a device layout that can be employed in accordance with an embodiment of the present application.

FIG. 2A is a cross sectional view of an exemplary structure that can be employed in the present application and through X-X shown in FIG. 1, the exemplary structure including a material stack of alternating layers of a sacrificial semiconductor material and a semiconductor channel material located on a surface of a semiconductor substrate.

FIG. 3A is a cross sectional view of the exemplary structure of FIG. 2A after cutting the material stack by forming an opening that extends entirely through the material stack and into a portion of the semiconductor substrate, wherein the cutting of the material stack provides a first material stack in a pFET device region and a second material stack in an nFET device region.

FIG. 3B is a cross sectional view of the exemplary structure of FIG. 2B after cutting the material stack by forming an opening that extends entirely through the material stack and into a portion of the semiconductor substrate, wherein the cutting of the material stack provides a first material stack in a pFET device region and a second material stack in an nFET device region.

FIG. 4A is a cross sectional view of the exemplary structure of FIG. 3A after forming a dielectric spacer along the sidewall of the opening.

FIG. 4B is a cross sectional view of the exemplary structure of FIG. 3B after forming a dielectric spacer along the sidewall of the opening.

FIG. 5A is a cross sectional view of the exemplary structure of FIG. 4A after forming a dielectric pillar in a remaining volume of the opening, wherein the dielectric pillar is laterally surrounded by the dielectric spacer.

FIG. 5B is a cross sectional view of the exemplary structure of FIG. 4B after forming a dielectric pillar in a remaining volume of the opening, wherein the dielectric pillar is laterally surrounded by the dielectric spacer.

DETAILED DESCRIPTION

Figure 2C:
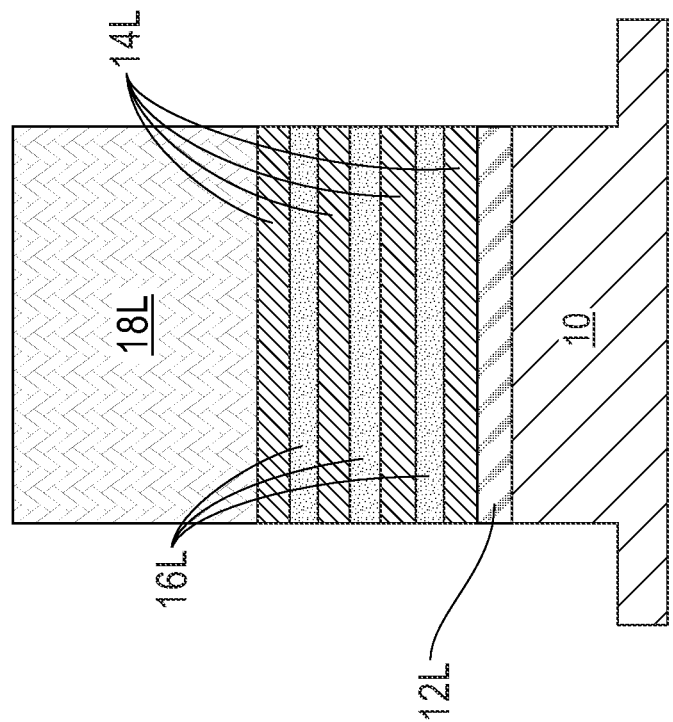
FIG. 2C is a cross sectional view of an exemplary structure that can be employed in the present application and through Y2-Y2 shown in FIG. 1, the exemplary structure including a material stack of alternating layers of a sacrificial semiconductor material and a semiconductor channel material located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a top down view of an exemplary semiconductor device layout that can be employed in accordance with an embodiment of the present application. The illustrated semiconductor device layout includes a plurality of functional gate structure, GS, that are oriented parallel to each other, each functional gate structure is present in a pFET device region and an nFET device region that is separated by a dielectric pillar. The semiconductor device layout illustrated in FIG. 1 will be used to describe a fork sheet device of the present application. FIG. 1 includes a cut X-X which bisects each functional gate structure, GS, and is located in the pFET device region of the fork sheet device. FIG. 1 also includes cut Y1-Y1 which is along the length direction of the gate structures, GS, and in area (i.e., a source/drain area) between two adjacent gate structures, GS. FIG. 1 further includes cut Y2-Y2 which is also along the length of the gate structures and through one of the gate structures.

It is noted that in the present application, FIGS. 2A, 3A, 4A, 5A, 6A, 7A, 8A, 9A, 10A, 11A, 12A and 13A illustrate the exemplary semiconductor device at cut X-X after different processing steps of the present application, FIGS. 2B, 3B, 4B, 5B, 6B, 7B, 8B, 9B, 10B, 11B, 12B and 13B illustrate the exemplary semiconductor device at cut Y1-Y1 after different processing steps of the present application, and FIGS. 2C, 3C, 4C, 5C, 6C, 7C, 8C, 9C, 10C, 11C, 12C and 13C illustrate the exemplary semiconductor device at cut Y2-Y2 after different processing steps of the present application.

It is further noted that while the present application describes and illustrates a pFET device region and an nFET device, the present application works with two pFET device regions or two nFET device regions.

Figure 2B:
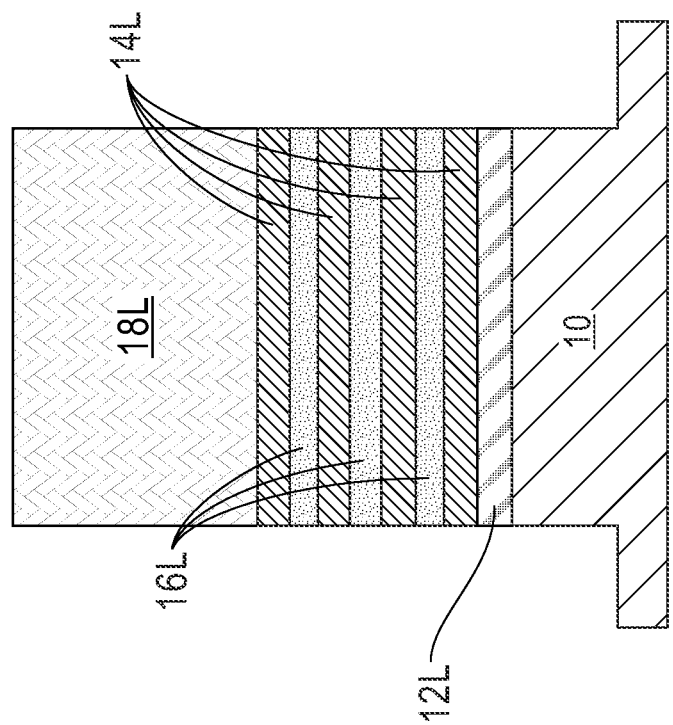
FIG. 2B is a cross sectional view of an exemplary structure that can be employed in the present application and through Y1-Y1 shown in FIG. 1, the exemplary structure including a material stack of alternating layers of a sacrificial semiconductor material and a semiconductor channel material located on a surface of a semiconductor substrate.

Referring first to FIGS. 2A, 2B and 2C, there are shown through various views, as explained above, an exemplary structure that can be employed in the present application. The exemplary structure shown in FIGS. 2A, 2B and 2C includes a material stack, MS, of alternating layers of a sacrificial semiconductor material 14L and a semiconductor channel material 16L located on a surface (i.e., active device region) of a semiconductor substrate 10. As is known to those skilled in the art, the active device region of a substrate, such as semiconductor substrate 10, is an area in which one or more semiconductor devices (i.e., fork sheet devices) are formed. The active device region of a substrate, such as semiconductor substrate 10, is located laterally adjacent to a non-active device region. The non-active device region is defined herein by the area in which a shallow trench structure (to be subsequently formed) is present.

The exemplary structure shown in FIGS. 2A, 2B and 2C further includes a sacrificial dielectric cap 18L located on the material stack, MS. In some embodiments and as is shown in FIGS. 2A, 2B and 2C, an optional placeholder material layer 12L can be present. As is shown, and when present, the optional placeholder material layer 12L is located between the material stack, MS, and the semiconductor substrate 10.

In one embodiment, the exemplary structure shown in FIGS. 2A, 2B and 2C can be formed by first providing the semiconductor substrate 10. Next, the optional placeholder material layer 12L, the material stack, MS, including alternating layers of sacrificial semiconductor material 14L and semiconductor channel material 16L, and the sacrificial dielectric cap 18L are formed by first epitaxially growing a blanket layer of the optional placeholder material, followed by growing alternating blanket layers of sacrificial semiconductor material and semiconductor channel material, and thereafter depositing a blanket layer of a sacrificial dielectric material. In one example, the blanket layers of the optional placeholder, alternating blanket layers of sacrificial semiconductor material and semiconductor channel material can be deposited utilizing epitaxial growth. The blanket layer of a sacrificial dielectric material can be deposited using conventional deposition techniques such as chemical vapor deposition (CVD), physical vapor deposition (PVD) or atomic layer deposition (ALD). The blanket layer of the optional placeholder material, alternating blanket layers of sacrificial semiconductor material and semiconductor channel material, and the blanket layer of a sacrificial dielectric material are then patterned by lithography and etching through each of the blanket layers and a top portion of the semiconductor substrate 10 to provide the structure shown in FIGS. 2A, 2B and 2C. Note that the etching through the top portion of the semiconductor substrate 10 provides a substrate having recessed portions located laterally adjacent to a mesa portion; the mesa portion defines an active device region of the present application.

It is noted that the number of material stacks, MS, and alternating layers of sacrificial semiconductor material 14L and semiconductor channel material 16L within the material stack, MS, can vary and is not limited to the number illustrated in the drawings of the present application.

The semiconductor substrate 10 can be composed of one or more semiconductor materials. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the entirety of the semiconductor substrate 10 is composed of one or more semiconductor materials. In such an embodiment, semiconductor substrate 10 can be referred to a bulk semiconductor substrate.

In another embodiment of the present application, semiconductor substrate 10 can be composed of a multilayered stack of from bottom to top, a bottom semiconductor material layer, an insulator material layer, and a top semiconductor material layer. Such a semiconductor substrate 10 can be referred to as a semiconductor-on-insulator (SOI) substrate. In such an embodiment, the top and bottom semiconductor material layers can be composed of one of the semiconductor materials mentioned above, and the insulator material layer can be composed of a dielectric material such as, for example, silicon oxide, and/or boron nitride. An SOI substrate can be made utilizing processing techniques well known to those skilled in the art. For example, a SOI substrate can be formed by a process referred to as a SIMOX (separation by ion implantation of oxygen) in which oxygen ions are implanted into a bulk semiconductor material and then an anneal is performed to convert the implanted oxygen region into an oxide layer. Alternatively, the SOI substrate can be formed by a bonding process in which an oxide (an/or boron nitride) layer that is formed on a semiconductor material layer is bonded to a base semiconductor material layer.

In one embodiment, the optional placeholder material layer 12L can be composed of a semiconductor material that is compositionally different from the upper semiconductor material portion of the semiconductor substrate 10, as well as the alternating layers of sacrificial semiconductor material 14L and semiconductor channel material 16L that are present in the material stack, MS. In one example, and when the upper semiconductor material portion of the substrate 10 and the layers of semiconductor channel material 16L are composed of silicon, and the layers of sacrificial semiconductor material 14L are composed of silicon germanium alloy having a first germanium content (such as, for example, 30 atomic percent germanium), the optional placeholder material layer 12L can be composed of a silicon germanium alloy having a second germanium content (such as, for example, 60 atomic percent germanium) that differs from the first germanium content.

As mentioned above, the material stack, MS, includes alternating layers of sacrificial semiconductor material 14L and semiconductor channel material 16L. Each layer of sacrificial semiconductor material 14L within the material stack, MS, can be referred to as a "sacrificial semiconductor material layer", and each layer of semiconductor channel material 16L within the material stack, MS, can be referred to as a "semiconductor channel material layer". As is shown in the illustrated embodiment, each semiconductor channel material layer 16L of the material stack, MS, is sandwiched between top and bottom sacrificial semiconductor material layers 14L. Thus, the material stack, MS, can include n+1 sacrificial semiconductor material layers 14L, and n semiconductor channel material layers 16L, wherein n is a number starting from one. By way of one example, the illustrated material stack, MS, includes four layers of sacrificial semiconductor material 14L, and three layers of semiconductor channel material 16L Each layer of sacrificial semiconductor material 14L is composed of a first semiconductor material, while each layer of semiconductor channel material 16L is composed of a second semiconductor material that is compositionally different from the first semiconductor material. In some embodiments, the second semiconductor material that provides each layer of semiconductor channel material 16L is a semiconductor material that is capable of providing high channel mobility for nFET devices. In other embodiments, the second semiconductor material that provides each layer of semiconductor channel material 16L is a semiconductor material that is capable of providing high channel mobility for pFET devices.

The first semiconductor material that provides each layer of sacrificial semiconductor material 14L and the second semiconductor material that provides each layer of semiconductor channel material 16L can include one of the semiconductor materials mentioned above for semiconductor substrate 10. In the present application, the first semiconductor material that provides each layer of sacrificial semiconductor material 14L can be compositionally the same as, or compositionally different from, at least an uppermost semiconductor material portion of the semiconductor substrate 10; when an optional placeholder material layer 12L is present, the first semiconductor material that provides each layer of sacrificial semiconductor material 14L is compositionally different from the optional placeholder material layer 12L. Typically, the first semiconductor material that provides each layer of sacrificial semiconductor material 14L is compositionally different from at least the uppermost semiconductor material portion of the semiconductor substrate 10. The second semiconductor material that provides each layer of semiconductor channel material 16L can be compositionally the same as, or compositionally different from, at least an uppermost semiconductor material portion of the semiconductor substrate 10; when an optional placeholder material layer 12L is present, the second semiconductor material that provides each layer of semiconductor channel material 16L is compositionally different from the optional placeholder material layer 12L. Typically, the second semiconductor material that provides each layer of semiconductor channel material 16L is compositionally the same as at least the uppermost semiconductor material portion of the semiconductor substrate 10. In one example, the semiconductor substrate 10 is composed of silicon, the first semiconductor material that provides each layer of sacrificial semiconductor material 14L is composed of a silicon germanium alloy, and the second semiconductor material that provides each layer of semiconductor channel material 16L is composed of silicon. Other combinations of semiconductor materials are possible as long as the first semiconductor material that provides each layer of sacrificial semiconductor material 14L is compositionally different from the second semiconductor material that provides each layer of semiconductor channel material 16L.

At this point of the present application, each layer of sacrificial semiconductor material 14L has a width that is the same as a width of each layer of semiconductor channel material 16L. As such, and at this point of the present application, the sidewalls of each layer of sacrificial semiconductor material 14L are vertically aligned with the sidewalls of each layer of semiconductor channel material 16L; when an optional placeholder material layer 12L is present, the sidewalls of each layer of sacrificial semiconductor material 14L and each layer of semiconductor channel material 16L are vertically aligned to sidewalls of the optional placeholder material layer 12L (thus, and when present, the optional placeholder material layer 12L has a same width as each layer of sacrificial semiconductor material 14L and each layer of semiconductor channel material 16L). A typical width for each layer of sacrificial semiconductor material 14L, each layer of semiconductor channel material 16L, and if present the optional placeholder material layer 12L is from 10 nm to 100 nm. Other widths are contemplated and can be used as the widths of each layer of sacrificial semiconductor material 14L, each layer of semiconductor channel material 16L, and, if present, the optional placeholder material layer 12L.

The thickness (i.e., height) of each layer of sacrificial semiconductor material 14L can be the same or different from the thickness of each layer of semiconductor channel material 16L. A typical thickness for each layer of sacrificial semiconductor material 14L, and each layer of semiconductor channel material 16L is from 4 nm to 20 nm. Other thicknesses are contemplated and can be used as the thickness of each layer of sacrificial semiconductor material 14L and each layer of semiconductor channel material 16L. The thickness of the optional placeholder material layer 12L can be within the range mentioned above for the thickness of the layers of sacrificial semiconductor material 14L and layers of the semiconductor channel material 16L.

The sacrificial dielectric cap 18L is composed of a hard mask material (e.g., sacrificial dielectric material) such as, for example, silicon dioxide, silicon nitride, silicon oxynitride, or any suitable combination of those dielectric materials. The sacrificial dielectric cap 18L can have a thickness from 10 nm to 100 nm; although other thicknesses for the sacrificial dielectric cap 18L are contemplated and can be used in the present application as the thickness of the sacrificial dielectric cap 18L.

Figure 3C:
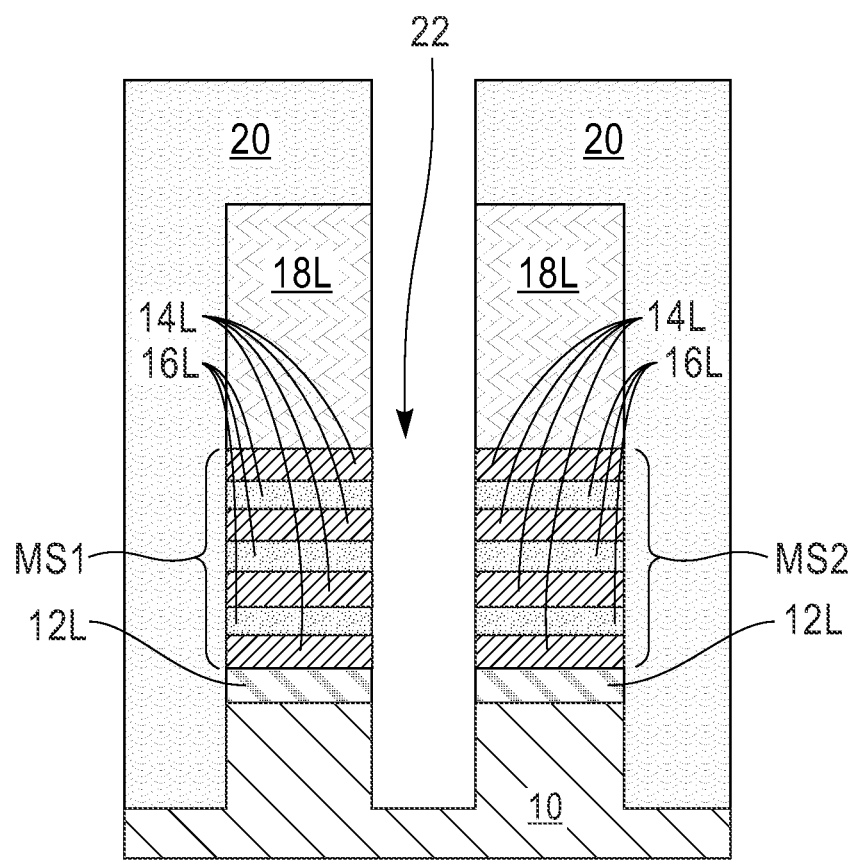
FIG. 3C is a cross sectional view of the exemplary structure of FIG. 2C after cutting the material stack by forming an opening that extends entirely through the material stack and into a portion of the semiconductor substrate, wherein the cutting of the material stack provides a first material stack in a pFET device region and a second material stack in an nFET device region.

Referring now to FIGS. 3A, 3B and 3C, there are illustrated the exemplary structure of FIGS. 2A, 2B and 2C, respectively, after cutting the material stack, MS, by forming an opening 22 that extends entirely through the material stack, MS, and into a portion of the semiconductor substrate 10. The cutting of the material stack, MS, including forming a masking material such as, for example, an organic planarization layer, over the entirety of the exemplary structure shown in FIGS. 2A, 2B and 2C, lithographically patterning the masking material to provide a patterned mask having the shape of opening 22, and thereafter transferring the shape provided by the patterned mask entirely through the dielectric cap 18L, the material stack, MS, if present the optional placeholder material layer 12L, and partially into the semiconductor substrate 10.

The patterned mask can be composed of any conventional masking material including, for example, a multilayered stack of, from bottom to top, an organic planarization layer (OPL), a SiARC, and a photoresist. In the drawing and by way of one example, only a patterned OPL 20 is shown. The masking material can be formed utilizing a deposition process including, for example, CVD, plasma enhanced chemical vapor deposition (PECVD), spin-on coating, or evaporation. After litho exposure and development, the unwanted photoresist is removed, followed by SiARC and OPL patterning. Finally, the transferring step can include one or more etching steps such as, for example, dry etching and/or chemical wet etching to etch through the dielectric cap 18L, the material stack, MS, if present the optional placeholder material layer 12L, and partially into the semiconductor substrate 10, during which all remaining photoresist and SiARC are removed, thus FIGS. 3A, 3B and 3C only show the patterned OPL 20 that remains.

As is shown, the material stack, MS, is cut into a first material stack, MS1, and a second material stack, MS2. The first material stack, MS1, is located in a pFET device region, while the second material stack, MS2 is located in an nFET device region. The first material stack, MS1, can be referred to as a pFET material stack, while the second material stack, MS, can be referred to as an nFET material stack. The first material stack, MS1, includes a remaining first portion of the material stack, MS, including alternating layers of sacrificial semiconductor material 14L and semiconductor channel material 16L, and the second material stack, MS, includes a remaining second portion of the material stack, MS, including alternating layers of sacrificial semiconductor material 14L and semiconductor channel material 16L.

After cutting the material stack, and as is further shown in FIGS. 3A, 3B and 3C, a first remaining portion of sacrificial dielectric cap 18L is located on the first material stack, MS1, and a second remaining portion of the sacrificial dielectric cap 18L is located on the second material stack, MS2.

In some embodiments and is illustrated in FIGS. 3A, 3B, and 3C, the first material stack, MS1, is located on a first remaining portion of the optional placeholder material layer 12L, while, and as is illustrated in FIGS. 3B and 3C, the second material stack, MS2, is located on a second remaining portion of the optional placeholder material layer 12L.

Figure 4C:
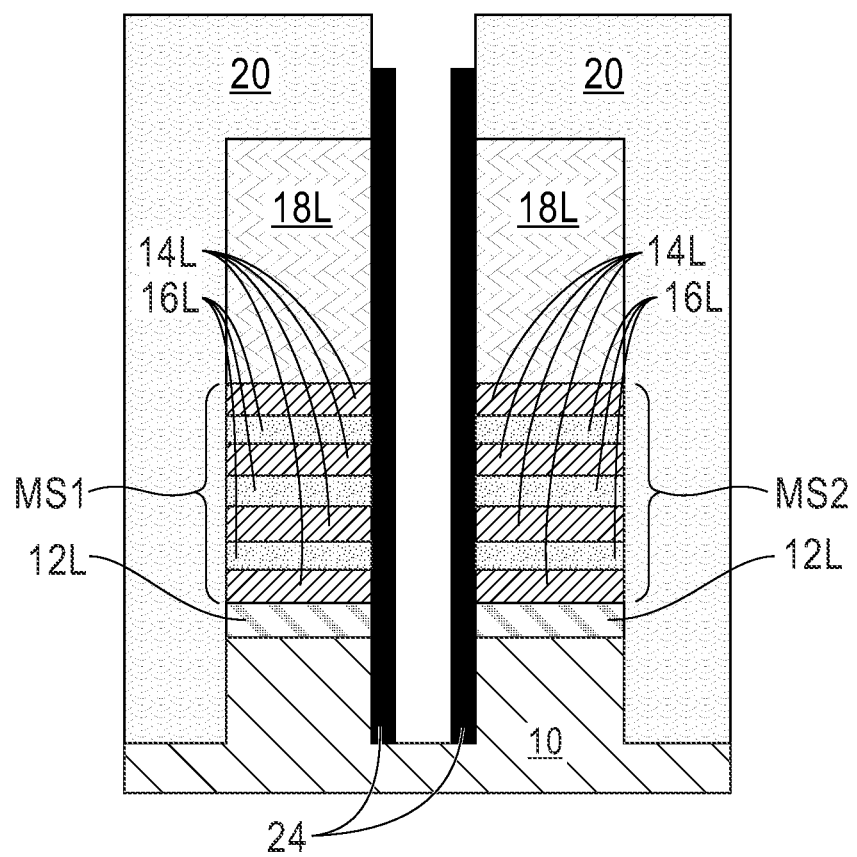
FIG. 4C is a cross sectional view of the exemplary structure of FIG. 3C after forming a dielectric spacer along the sidewall of the opening.

Referring now to FIGS. 4A, 4B and 4C, there are illustrated the exemplary structure of FIGS. 3A, 3B and 3C, respectively, after forming a dielectric spacer 24 along the sidewall of the opening 22. The dielectric spacer 24 is formed by depositing a spacer dielectric material, followed by a spacer etch. The depositing of the spacer dielectric material can include, but is not limited to, CVD, PECVD, PVD or ALD. The spacer etch can include an anisotropic reactive ion etch.

In some embodiments, the dielectric spacer material that provides dielectric spacer 24 can be composed of silicon oxide. Other dielectric spacer materials can be used to besides silicon oxide. The dielectric spacer 24 can have a thickness from 2 nm to 15 nm; although other thicknesses for the dielectric spacer 24 are contemplated and can be used as the thickness of the dielectric spacer 24 in the present application as long as the dielectric spacer 24 does not completely fill in the volume of opening 22. The dielectric spacer 24 has a topmost surface that is typically located between a topmost surface of the first and second remaining portions of the sacrificial dielectric cap 18L and a topmost surface of the patterned OPL 20, and a bottommost surface that is located on a sub-surface of semiconductor substrate 10. By "sub-surface" it is meant a surface of a material that is located between a topmost surface of the material and a bottommost surface of the material.

As is shown in FIGS. 4B and 4C, the dielectric spacer 24 that is located laterally adjacent to the pFET device region has an outermost sidewall that is in direct physical contact with the first material stack, MS1, and the dielectric spacer 24 that is located laterally adjacent to the nFET device region has an outermost sidewall that is in direct physical contact with the second material stack, MS2.

Figure 5C:
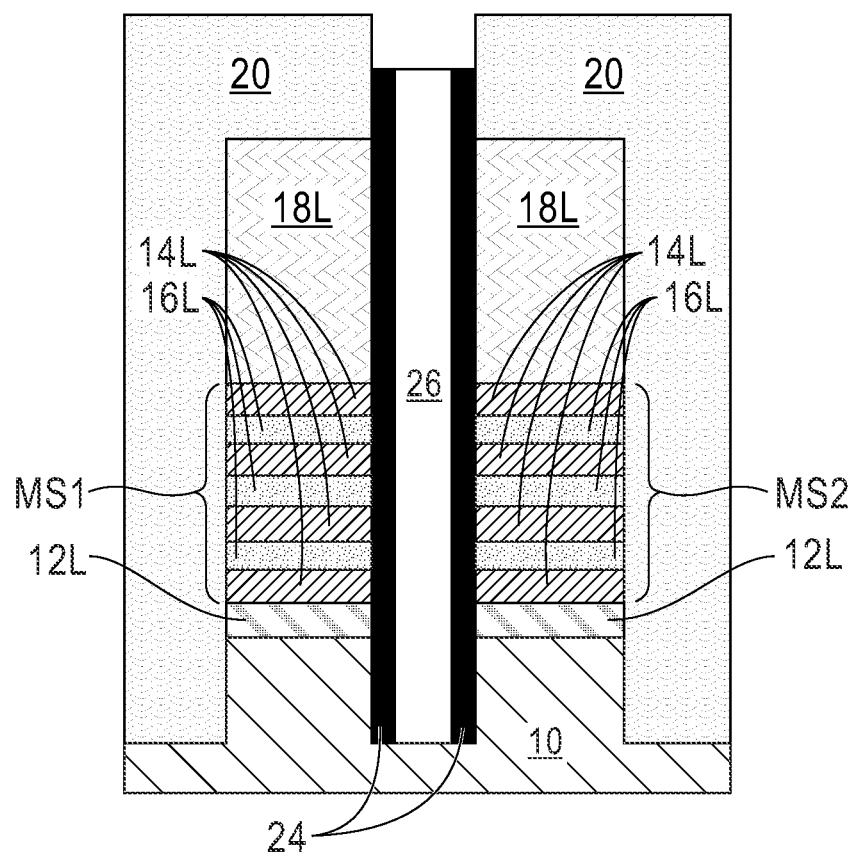
FIG. 5C is a cross sectional view of the exemplary structure of FIG. 4C after forming a dielectric pillar in a remaining volume of the opening, wherein the dielectric spacer is laterally surrounded by the dielectric spacer.

Referring now to FIGS. 5A, 5B and 5C, there are illustrated the exemplary structure of FIGS. 4A, 4B and 4C, respectively, after forming a dielectric pillar 26 in a remaining volume of the opening 22, wherein the dielectric pillar 26 is laterally surrounded by the dielectric spacer 24. The dielectric pillar 26 is composed of a dielectric material that is compositionally different from the dielectric spacer material that provides dielectric spacer 24. In one example, the dielectric pillar 26 is composed of a silicon carbon based dielectric material such as, for example, silicon carbide or a dielectric including atoms of Si, C and O. Other dielectric materials besides a silicon carbon based dielectric material can be used as the dielectric material that provides the dielectric pillar 26 as long as the dielectric material that provides the dielectric pillar 26 is compositionally different from the dielectric spacer material that provides the dielectric spacer 24.

The dielectric pillar 26 can be formed by first depositing a dielectric material, and thereafter recessing the deposited dielectric material. The depositing of the dielectric material that provides the dielectric pillar 26 can include ALD, CVD, PECVD, or PVD, and the recessing of the deposited dielectric material that provides the dielectric pillar 26 can include an etch that is selective in removing the dielectric material that provides the dielectric pillar 26.

In some embodiments and as is shown in FIGS. 5B and 5C, the dielectric pillar 26 has a topmost surface that is substantially coplanar with a topmost surface of the dielectric spacer 24. In other embodiments, the dielectric pillar 26 has a topmost surface that is located above or below a topmost surface of the dielectric spacer 24. The height of the dielectric pillar 26 exceeds that height of the first material stack, MS1, and the second material stack, M2. A bottommost surface of the dielectric pillar 26 contacts the sub-surface of the semiconductor substrate 10 and is coplanar with a bottommost surface of the dielectric spacer 24.

Figure 6B:
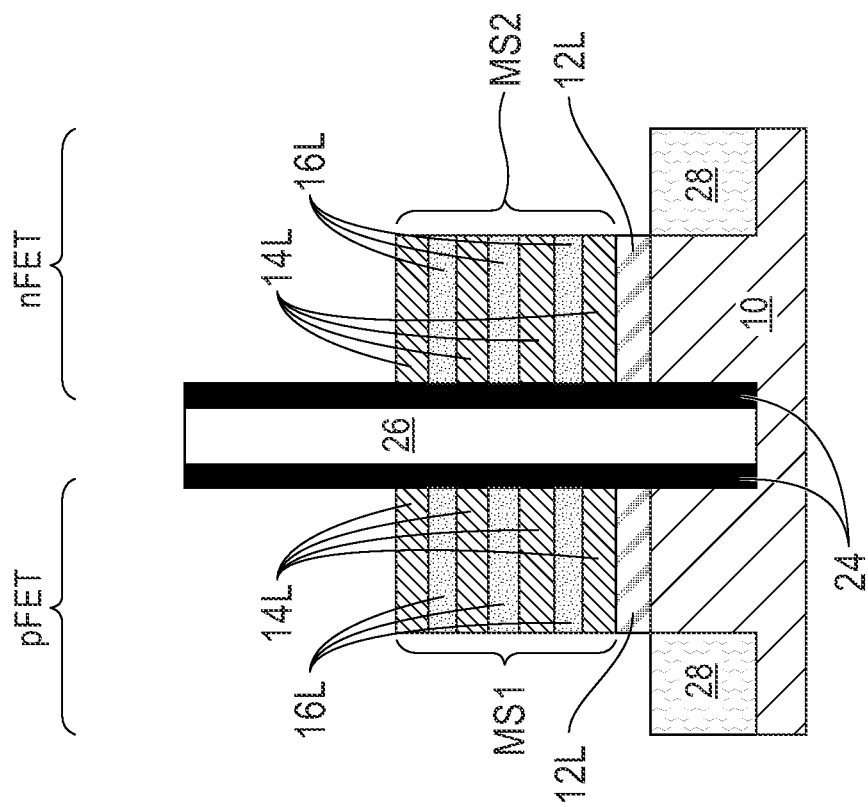
FIG. 6B is a cross sectional view of the exemplary structure of FIG. 5C after forming a shallow trench isolation structure in the semiconductor substrate and revealing the first and second material stacks.
Figure 6A:
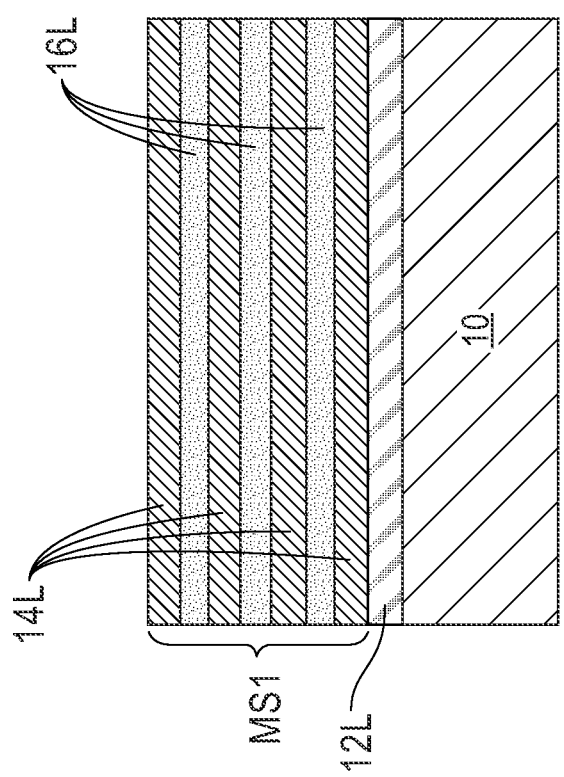
FIG. 6A is a cross sectional view of the exemplary structure of FIG. 5A after forming a shallow trench isolation structure in the semiconductor substrate and revealing the first and second material stacks.
Figure 6C:
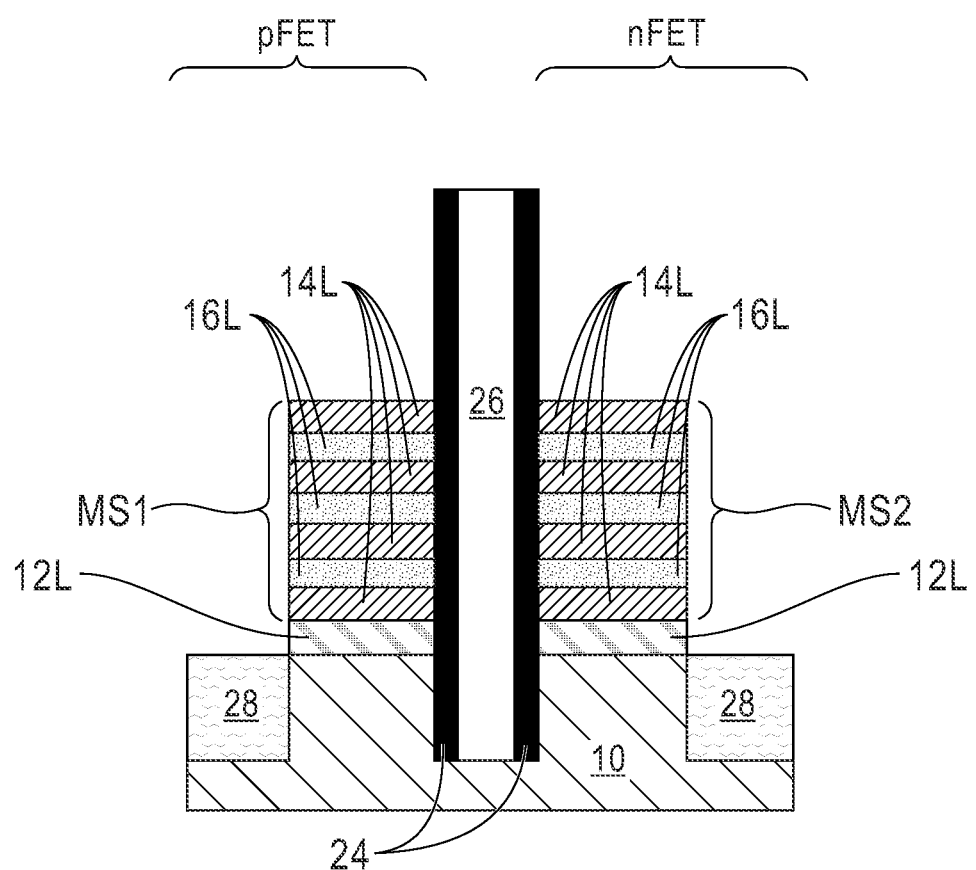
FIG. 6C is a cross sectional view of the exemplary structure of FIG. 5C after forming a shallow trench isolation structure in the semiconductor substrate and revealing the first and second material stacks.

Referring now to FIGS. 6A, 6B and 6C, there are illustrated the exemplary structure of FIGS. 5A, 5B and 5C, respectively, after forming a shallow trench isolation structure 28 in the semiconductor substrate 10 and revealing the first material stack, MS1, and the second material stack, MS2. Prior to forming the shallow trench isolation structure 28, the patterned OPL 20 is first removed utilizing any mask stripping process; the mask stripping process does not remove the sacrificial dielectric cap 18L that is located above the first material stack, MS1, and the second material stack, MS2.

The shallow trench isolation structure 28 can be composed of a trench dielectric material such as, for example, silicon oxide. The shallow trench isolation structure 28 can be formed by filling the area above the recessed region of the semiconductor substrate 10 with a trench dielectric material. In some embodiments, and prior to the filling of the area above the recessed region of the semiconductor substrate 10, a trench dielectric liner such as, for example, silicon nitride, is formed, and thereafter the trench dielectric material is formed. In some embodiments, a recess etching process and/or densification process can be performed after the trench fill and CMP process. In some embodiments of the present application and as is shown in FIGS. 6A, 6B and 6C, the shallow trench isolation structure 28 has a topmost surface that is coplanar with a topmost surface of the mesa portion of the semiconductor substrate 10.

After forming the shallow trench isolation structure 28, the sacrificial dielectric cap 18L that is located above the first material stack, MS1, and the second material stack, MS2 is removed utilizing a material removal process that is selective in removing the dielectric material that provides the sacrificial dielectric cap 18L. In one embodiment, a selective wet etch process such, as for example, hot ammonia wet etch, can be used to remove the sacrificial dielectric cap 18L that is located above the first material stack, MS1, and the second material stack, MS2.

After removing the sacrificial dielectric cap 18L that is located above the first material stack, MS1, and the second material stack, MS2, the first material stack, MS1, in the pFET device region is revealed, and the second material stack, MS2, in the nFET device region is revealed. As is shown in FIGS. 6B and 6C, the dielectric spacer 24 and the dielectric pillar 26 separate the first material stack, MS1, the is present in the pFET device region from the second material stack, MS2, the is present in the nFET device region.

Figure 7B:
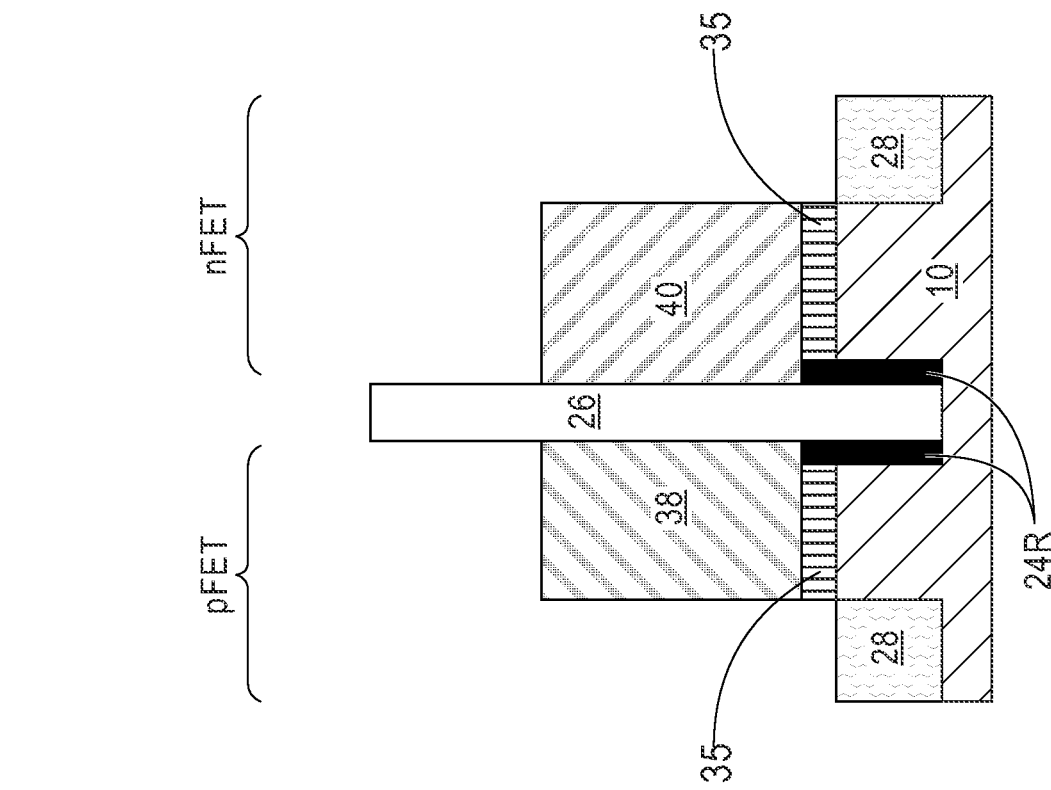
FIG. 7B is a cross sectional view of the exemplary structure of FIG. 6B after further device processing including forming sacrificial gate structures on the first and second material stacks, forming first and second nanosheet stacks of alternating nanosheets of sacrificial semiconductor material and semiconductor channel material from the first and second material stacks, respectively, recessing each sacrificial semiconductor material nanosheet, forming an inner spacer in a gap created by the recessing of each sacrificial semiconductor nanosheet, and forming source/drain regions.
Figure 7A:
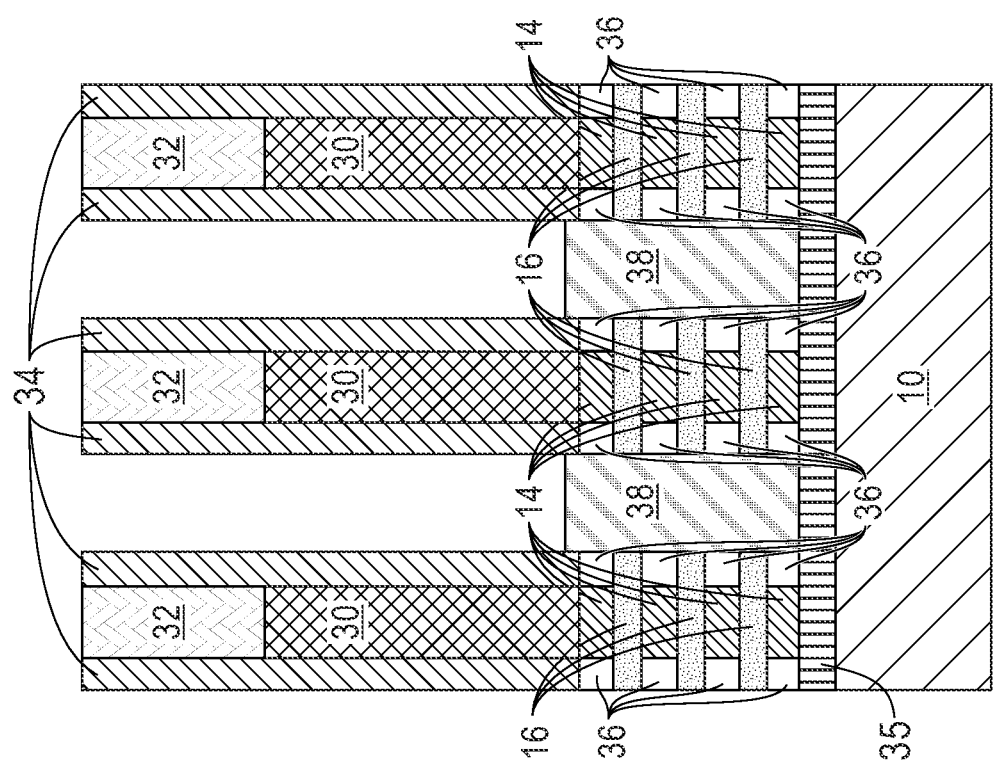
FIG. 7A is a cross sectional view of the exemplary structure of FIG. 6A after further device processing including forming sacrificial gate structures on the first and second material stacks, forming first and second nanosheet stacks of alternating nanosheets of sacrificial semiconductor material and semiconductor channel material from the first and second material stacks, respectively, recessing each sacrificial semiconductor material nanosheet, forming an inner spacer in a gap created by the recessing of each sacrificial semiconductor nanosheet, and forming source/drain regions.
Figure 7C:
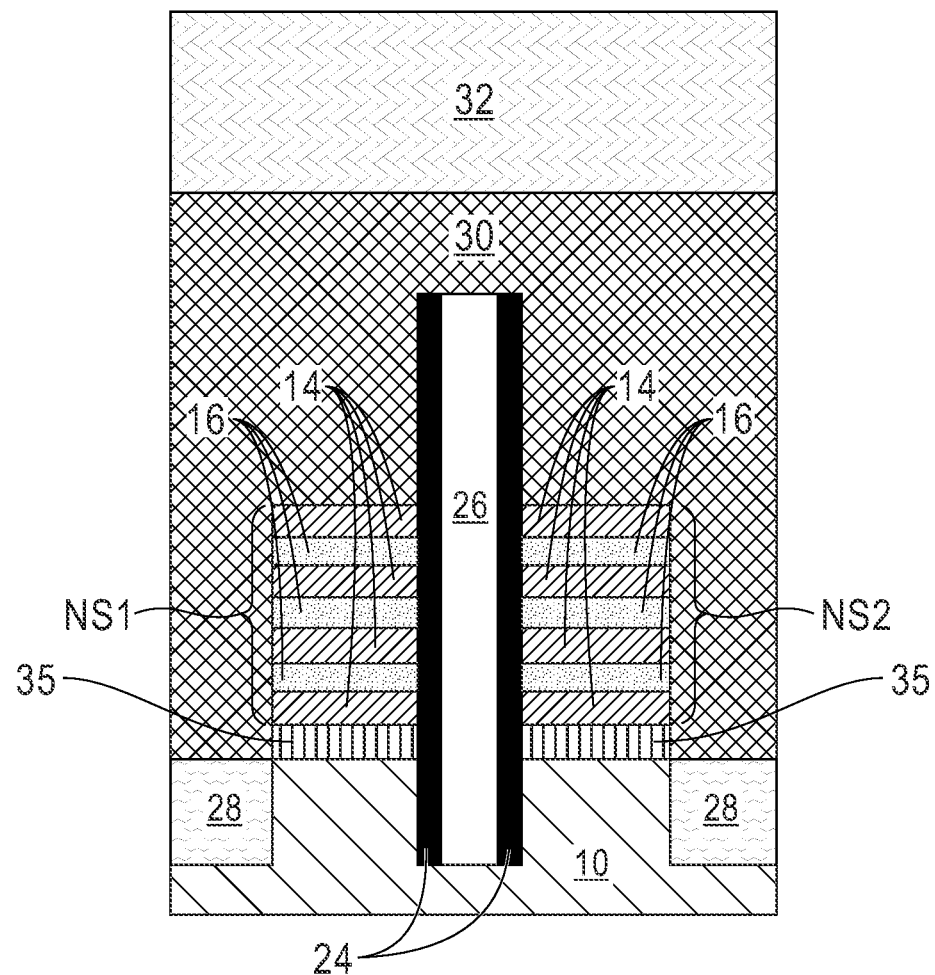
FIG. 7C is a cross sectional view of the exemplary structure of FIG. 6C after further device processing including forming sacrificial gate structures on the first and second material stacks, forming first and second nanosheet stacks of alternating nanosheets of sacrificial semiconductor material and semiconductor channel material from the first and second material stacks, respectively, recessing each sacrificial semiconductor material nanosheet, forming an inner spacer in a gap created by the recessing of each sacrificial semiconductor nanosheet, and forming source/drain regions.

Referring now to FIGS. 7A, 7B and 7C, there are illustrated the exemplary structure of FIGS. 6A, 6B and 6C, respectively, after further device processing including forming sacrificial gate structures on the first material stack, MS1, and the second material stack, MS2, removing the optional placeholder material layer 12L, forming gate spacer 34 and a bottom dielectric isolation layer 35 by depositing a conformal spacer liner followed by spacer RIE, forming first and nanosheet stacks, NS1 and NS2, of alternating nanosheets of sacrificial semiconductor material 14 and semiconductor channel material 16 from the first and second material stacks, MS1 and MS2, respectively, recessing each sacrificial semiconductor material nanosheet 14, forming an inner spacer 36 in a gap created by the recessing of each sacrificial semiconductor nanosheet 14, and forming source/drain regions 38/40. It is noted that while the present application does not depict an equivalent cut X-X in the nFET device as is shown in FIG. 7A, the cross sectional view of the equivalent cut X-X in the nFET would look similar to FIG. 7A except that the pFET source/drain regions 38, would be replaced with the nFET source/drain regions 40.

Each sacrificial gate structure includes an optional sacrificial gate dielectric material (not shown in the drawings of the present application), a sacrificial gate material 30, and a hard mask cap 32. The sacrificial gate dielectric material can be composed of a dielectric material such as, for example, silicon dioxide. The sacrificial gate material 30 can include, but is not limited to, polysilicon, amorphous silicon, amorphous silicon germanium, tungsten, titanium, tantalum, aluminum, nickel, ruthenium, palladium, platinum, or alloys of such metals. The hard mask cap 32 can be composed of a hard mask material such as, for example, silicon dioxide, silicon nitride, silicon oxynitride or any multilayered combination thereof. The sacrificial gate structures can be formed by depositing the various material layers that provide the sacrificial gate structures and then patterning these various deposited material layers by lithography and etching.

After forming the sacrificial gate structures, the optional placeholder material layer 12L is selectively removed forming a void at the bottom of the first and second material stacks, MS1, and MS2. After void formation, a gate dielectric spacer 34 is then formed by deposition of a dielectric spacer material, followed by a spacer etch. The dielectric spacer material that provides gate dielectric spacer 34 can include silicon dioxide or silicon nitride. The dielectric material that provides the gate dielectric spacer 34 will fill the void at the bottom of the first and second material stacks, MS1 and MS2, forming a bottom dielectric isolation layer 35 beneath each of the first and second material stacks, MS1 and MS2.

After forming the sacrificial gate structures, gate dielectric spacer and optional bottom dielectric isolation layer 35, the first and material stacks, MS1 and MS2, are patterned utilizing each sacrificial gate structure 30/32 and each gate dielectric spacer 34 as an etch mask. The patterning includes an etching process which removes physically exposed portions of the first and second material stacks, MS1 and MS2, not protected by the etch mask, while maintaining a portion of the first and second material stacks, MS1 and MS2, beneath each etch mask. The maintained portion of the first material stack that is located beneath the etch mask in the pFET device region is a first nanosheet stack, NS1, of alternating nanosheets of sacrificial semiconductor material 14 and semiconductor channel material 16. The maintained portion of the second material stack that is located beneath the etch mask in the nFET device region is a second nanosheet stack, NS2, of alternating nanosheets of sacrificial semiconductor material 14 and semiconductor channel material 16. Each sacrificial semiconductor material nanosheet 14 is composed of the first semiconductor material as mentioned above for the sacrificial semiconductor material layers 14L, and each semiconductor channel material nanosheet 16 is composed of the second semiconductor material as mentioned above for the semiconductor channel material layers 16L.

Each sacrificial semiconductor nanosheet 14 of the first and second nanosheet stacks, NS1 and NS2, has a same thickness as each layer of sacrificial semiconductor material 14L and a width that is reduced as compared to the width of each layer of sacrificial semiconductor material 14L. Each semiconductor channel material nanosheet 16 of the first and second nanosheet stacks, NS1 and NS2, has a same thickness as each layer of semiconductor channel material 16L, and a width that is reduced as compared to the width of each layer of semiconductor channel material 16L. The etch stops on the bottom dielectric isolation layer 35, if optional placeholder material layer 12L is present, or on a surface of the semiconductor substrate 10 if the optional placeholder material layer 12L is not present.

After defining the first and second nanosheet stack, NS1 and NS2, of alternating nanosheets of sacrificial semiconductor material 14 and semiconductor channel material 16, end portions of the each sacrificial semiconductor material nanosheet 14 are recessed to form a gap (not shown). The recessing includes a lateral etching process. An inner spacer 36 is then formed in the gap created by the recessing of each sacrificial semiconductor nanosheet 14. The forming of the inner spacers 36 includes conformal deposition of another dielectric spacer material and followed by an isotropic etching. The another dielectric spacer material can be compositionally the same as, or compositionally different from, the dielectric spacer material that provides dielectric gate spacer 34.

After inner spacer 36 formation, source/drain regions 38/40 are formed. The source/drain regions that are formed in the pFET device region can be referred to as pFET source/drain regions 38, while the source/drain regions that are formed in the nFET device region can be referred to as nFET source/drain regions 40. As used herein, a "source/drain" region can be a source region or a drain region depending on subsequent wiring and application of voltages during operation of the FET. The pFET source/drain regions 38 have a sidewall that is in direct physical contact with the outermost sidewalls of each nanosheet of semiconductor channel material 16 of the first nanosheet stack, NS1, and the nFET source/drain regions 40 have a sidewall that is in direct physical contact with the outermost sidewalls of each nanosheet of semiconductor channel material 16 of the second nanosheet stack, NS2.

Each pFET source/drain region 38 and each nFET source/drain region 40 includes a semiconductor material and a dopant. The semiconductor material that provides each pFET source/drain region 38 and each nFET source/drain region 40 can include one of the semiconductor materials mentioned above for the semiconductor substrate 10. The semiconductor material that provides each pFET source/drain region 38 and each nFET source/drain region 40 can be compositionally the same, or compositionally different from each nanosheet of semiconductor channel material 16. The semiconductor material that provides pFET source/drain region 38 and each nFET source/drain region 40 is however compositionally different from each recessed sacrificial semiconductor material nanosheet 14. The semiconductor material that provides the pFET source/drain regions 38 can be compositionally the same as, or compositionally different from, the semiconductor material that provides the nFET source/drain regions 40.

The dopant that is present in each pFET source/drain region 38 is a p-type dopant, while the dopant that is present in each nFET source/drain region 40 is an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each pFET source/drain region 38 and each nFET source/drain region 40 can have a dopant concentration of from $4 \times 10^{20}$ atoms/$cm^3$ to $3 \times 10^{21}$ atoms/$cm^3$. In some embodiments, and as is shown, the bottom dielectric isolation layer 35 is located beneath the pFET source/drain region 38 in the pFET device region, and another bottom dielectric isolation layer 35 is located beneath the nFET source/drain region 40 in the nFET device region.

Each pFET source/drain region 38 and each nFET source/drain region 40 can be formed by an epitaxial growth in which the dopants are present during the epitaxial growth process. The pFET source/drain region 38 and each nFET source/drain region 40 grow laterally outward from each of the nanosheets of semiconductor channel material 16. A recess etch can be optionally employed so as to reduce the height of each pFET source/drain region 38 and each nFET source/drain region 40. It is noted that during the epitaxial growth process, an epitaxial pre-clean process is performed that etches physically exposed portions of the dielectric spacer 24 within the source/drain regions shown in FIG. 7B to provide a reduced height dielectric spacer 24R. The reduced height dielectric spacer 24R is present on, and surrounds, a lower portion of the dielectric pillar 26. The reduced height dielectric spacer 24 can have a topmost surface that is coplanar with a topmost surface of the bottom dielectric isolation layer 35.

During this epitaxial pre-clean process, an upper portion of the dielectric pillar 26 is physically exposed in each of the pFET device region and the nFET device region such that the pFET source/drain regions 38 have a sidewall that directly contacts one sidewall of the dielectric pillar 26, and the nFET source/drain regions 40 has a sidewall that directly contacts another sidewall of the dielectric pillar 26 (See, FIG. 7B). As is shown in FIG. 7B, the height of the dielectric pillar 26 is greater than a height of each of the pFET source/drain regions 38 and the nFET source/drain regions 40.

It is noted that while the present application describes and illustrates two nanosheet devices containing pFET source/drain regions 38 and nFET source/drain regions 40, the present application also contemplate two nanosheet devices containing only nFET source/drain regions or two nanosheet devices containing only pFET source/drain regions. That is, the present application contemplates n-to-p, p-to-p, and n-to-n nanosheet devices.

Figure 8B:
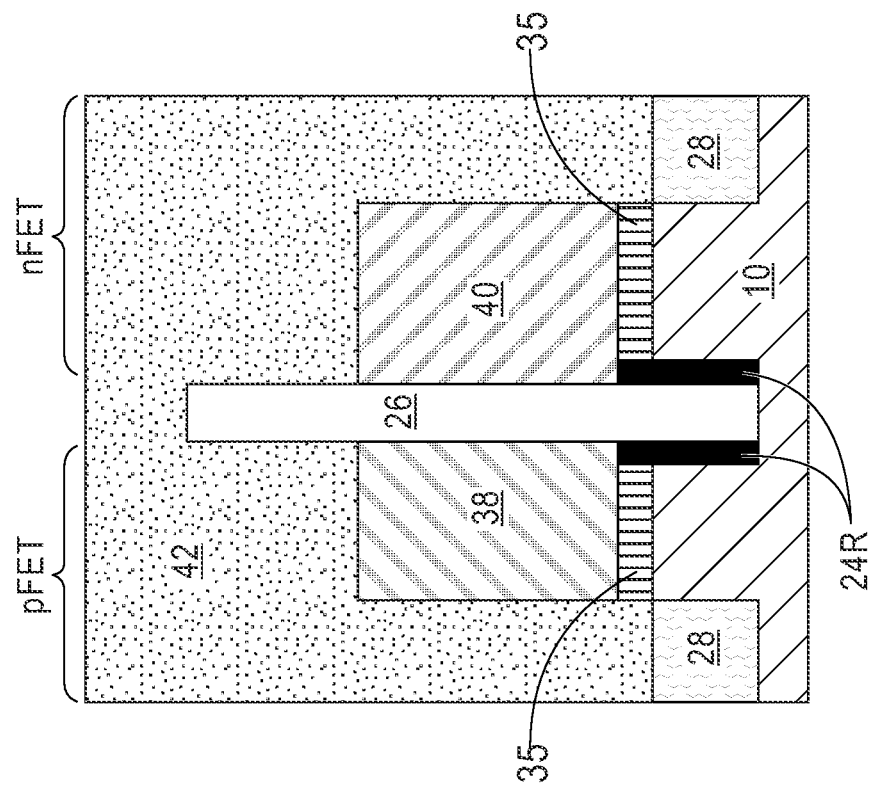
FIG. 8B is a cross sectional view of the exemplary structure of FIG. 7B after forming an interlayer dielectric material layer.
Figure 8A:
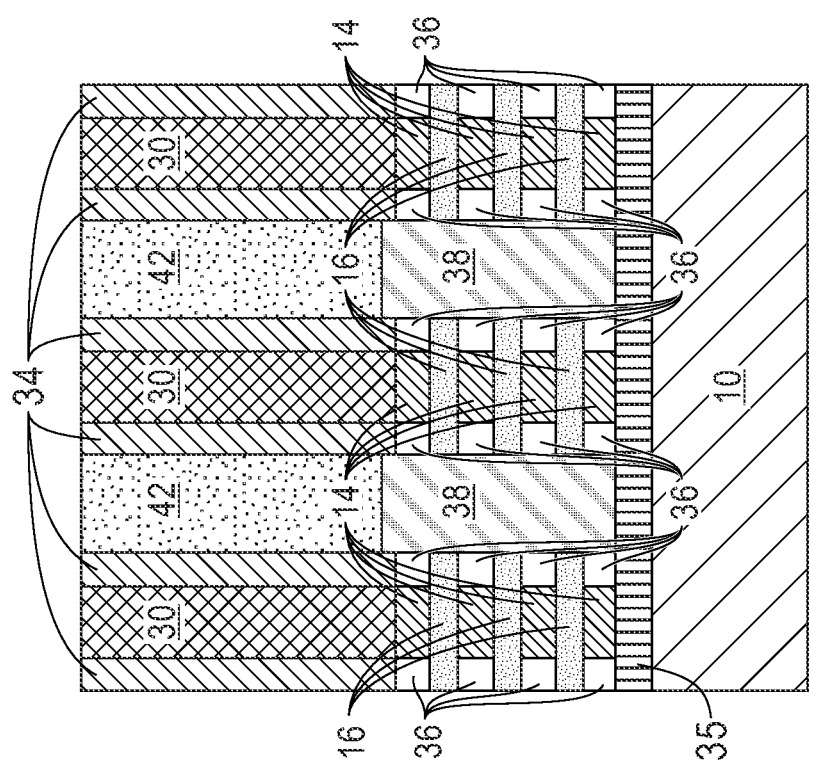
FIG. 8A is a cross sectional view of the exemplary structure of FIG. 7A after forming an interlayer dielectric material layer.
Figure 8C:
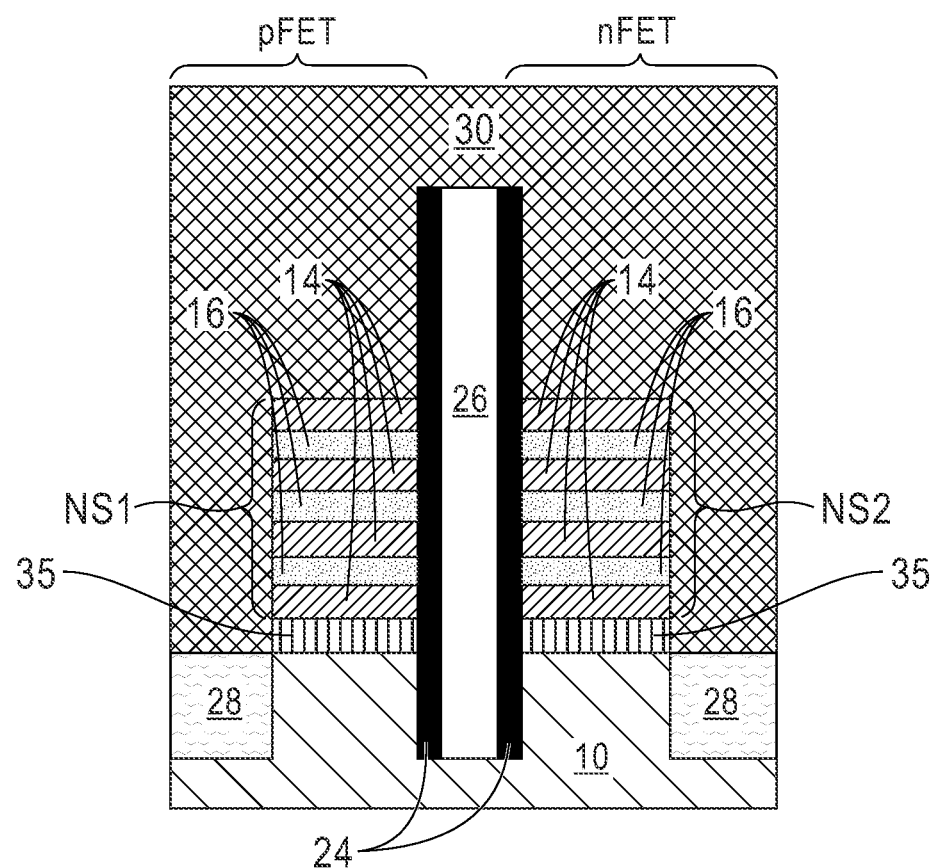
FIG. 8C is a cross sectional view of the exemplary structure of FIG. 7C after forming an interlayer dielectric material layer.

Referring now to FIGS. 8A, 8B and 8C, there are illustrated the exemplary structure of FIGS. 7A, 7B and 7C, respectively, after forming an interlayer dielectric (ILD) material layer 42. The ILD material layer 42 is formed atop each of the nFET device source/drain regions 38, the pFET device source/drain regions 40, and the dielectric pillar 26 and laterally adjacent to at least the sacrificial gate material 30 of each sacrificial gate structure 30/32.

The ILD material layer 42 can be composed of a dielectric material including, for example, silicon oxide, silicon nitride, undoped silicate glass (USG), fluorosilicate glass (FSG), borophosphosilicate glass (BPSG), a spin-on low-k dielectric layer, a CVD low-k dielectric layer or any combination thereof. The term "low-k" as used throughout the present application denotes a dielectric material that has a dielectric constant of less than silicon dioxide. Although not shown, the ILD material layer 42 can include a multilayered structure that includes at least two different dielectric materials stacked one atop the other such as, for example, silicon nitride and silicon dioxide. The ILD material layer 42 can be formed by a deposition process such as, for example, CVD, PECVD, or spin-on coating. A planarization process such as, for example, CMP, can be performed after the deposition of the dielectric material that provides the ILD material layer 42. The planarization process physically exposes a topmost surface of the sacrificial gate material 30 of each sacrificial gate structure 30/32. Thus, the planarization process removes each sacrificial dielectric hard mask 32 as well as an upper portion of each gate dielectric spacer 34. As is shown in FIG. 7A, the ILD material layer 42 has a topmost surface that is coplanar with a topmost surface of each sacrificial gate material 30 as well as a topmost surface of the remaining portion of each gate dielectric spacer 34.

Figure 9B:
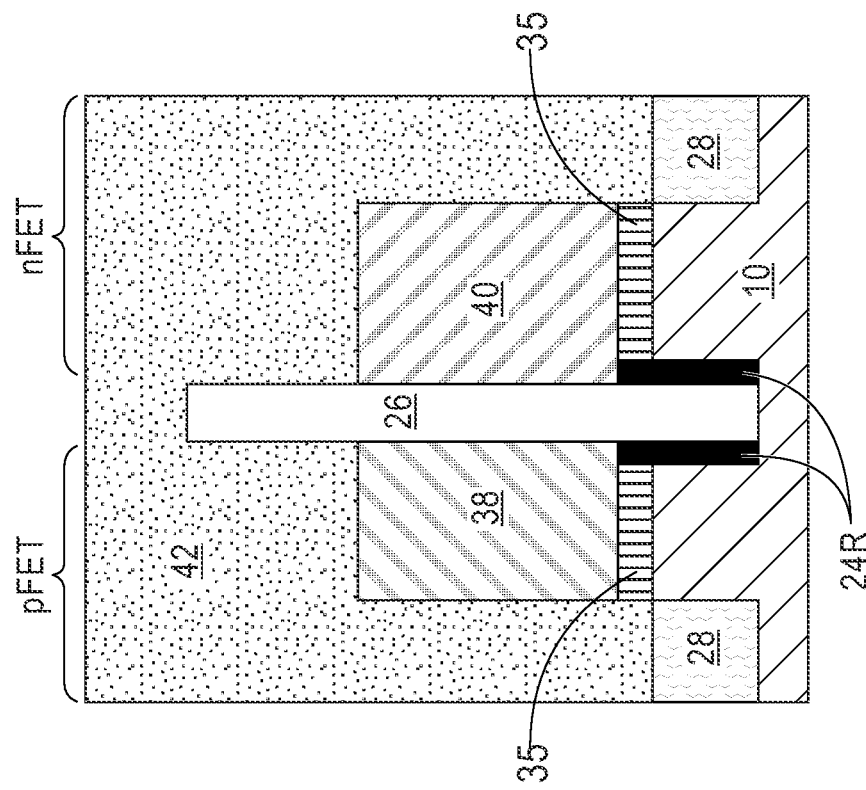
FIG. 9B is a cross sectional view of the exemplary structure of FIG. 8B after removing the sacrificial gate structures and the recessed sacrificial semiconductor nanosheets to provide first and second vertical nanosheet stacks of suspended semiconductor channel material nanosheets.
Figure 9A:
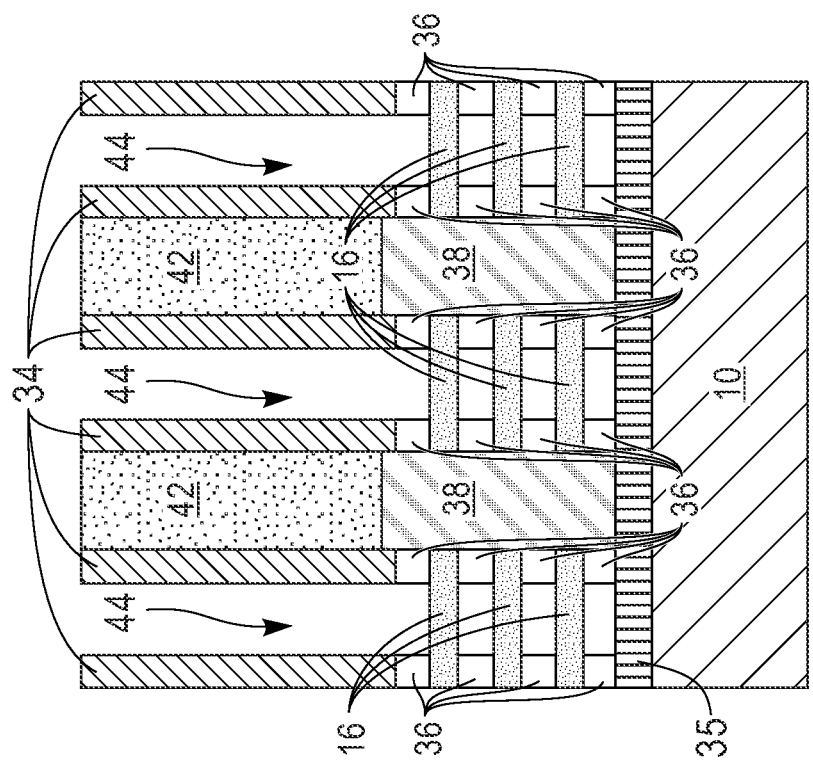
FIG. 9A is a cross sectional view of the exemplary structure of FIG. 8A after removing the sacrificial gate structures and the recessed sacrificial semiconductor nanosheets to provide vertical first and second nanosheet stacks of suspended semiconductor channel material nanosheets.
Figure 9C:
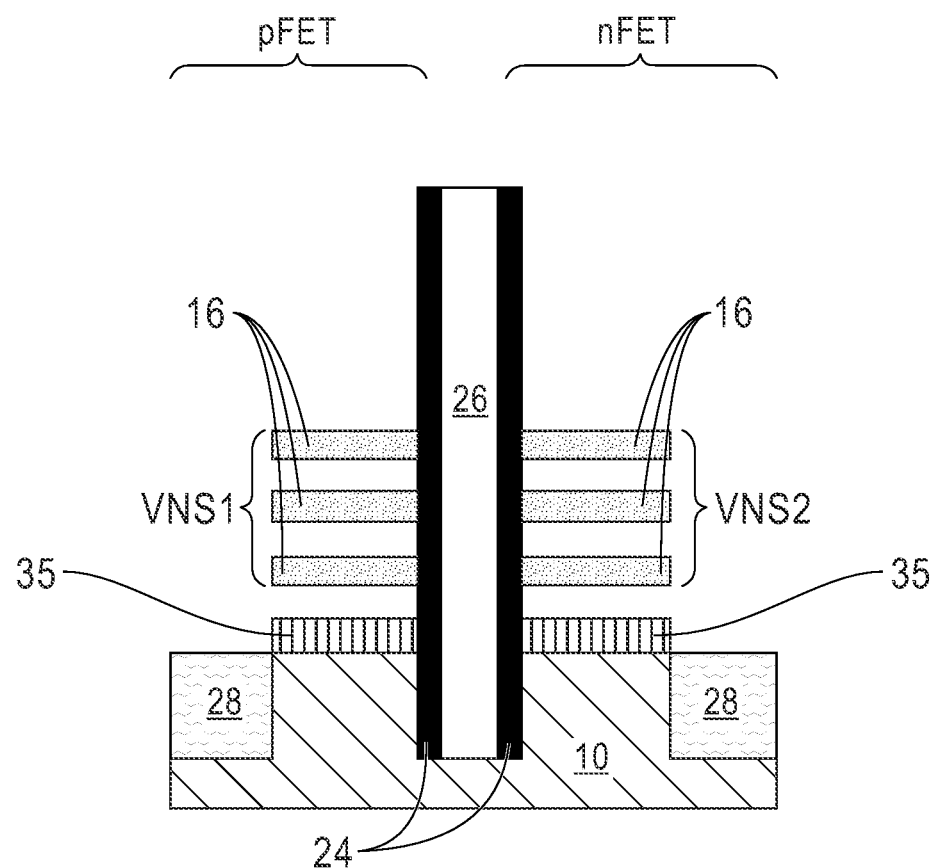
FIG. 9C is a cross sectional view of the exemplary structure of FIG. 8C after removing the sacrificial gate structures and the recessed sacrificial semiconductor nanosheets to provide first and second vertical nanosheet stacks of suspended semiconductor channel material nanosheets.

Referring now to FIGS. 9A, 9B and 9C, there are illustrated the exemplary structure of FIGS. 8A, 8B and 8C, respectively, after removing the sacrificial gate structures (note that since the sacrificial hard masks 32 were previously removed during the formation of the exemplary structure shown in FIGS. 8A, 8B and 8C, this step removes the sacrificial gate material 30 and, if present, the sacrificial gate dielectric material) and the recessed sacrificial semiconductor nanosheets 14 to provide a first vertical nanosheet stack, VNS1, of suspended semiconductor channel material nanosheets 16 in the pFET device region, and a second vertical nanosheet stack, VNS2, of suspended semiconductor channel material nanosheets 16 in the nFET device region.

Each sacrificial gate structure (i.e., the sacrificial gate material 30 and, if present, the sacrificial gate dielectric material) is removed to provide access to the sacrificial semiconductor material nanosheets 14. The sacrificial semiconductor material nanosheet 14 are then removed to provide a gate cavity 44 above and below the now suspended semiconductor channel material nanosheets 16 of the first and second vertical nanosheet stacks, VNS1 and VNS2. The removal of the sacrificial gate material 30 and, if present, the sacrificial gate dielectric material of each sacrificial gate structure can include one or more etching processes. In one example, one or more reactive ion etching processes can be used to remove the sacrificial gate material 30 and, if present, the sacrificial gate dielectric material of each sacrificial gate structure. The removal of each the sacrificial semiconductor material nanosheet 14 can include an etching process that is selective in removing the sacrificial semiconductor material relative to the semiconductor channel material.

Figure 10B:
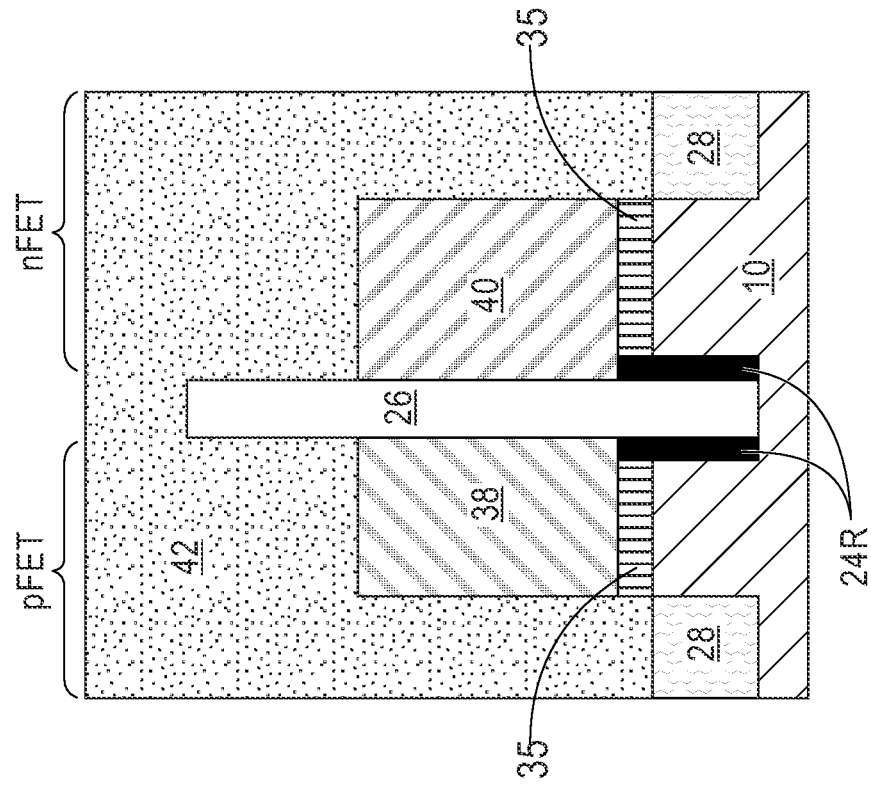
FIG. 10B is a cross sectional view of the exemplary structure of FIG. 9B after partial undercutting the dielectric spacer in accordance with one embodiment of the present application to provide a provide a plurality of horizontal dielectric bridge structures, wherein each horizontal dielectric bridge structure has a first end contacting a sidewall of the dielectric pillar and a second end, opposite the first end, and contacting a sidewall of one of the suspended semiconductor channel material nanosheets.
Figure 10A:
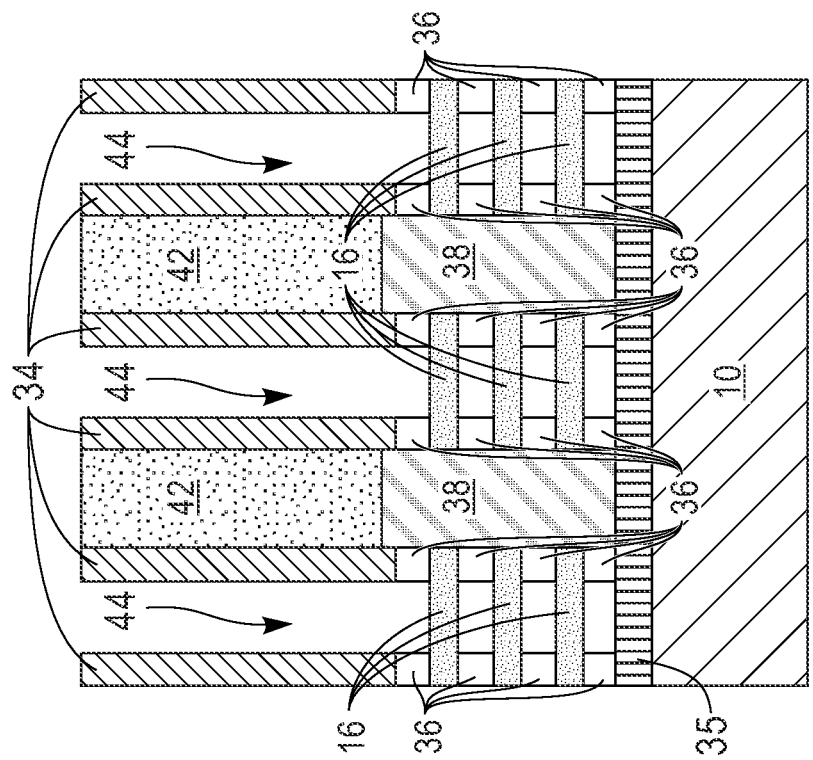
FIG. 10A is a cross sectional view of the exemplary structure of FIG. 9A after partial undercutting the dielectric spacer in accordance with one embodiment of the present application to provide a provide a plurality of horizontal dielectric bridge structures, wherein each horizontal dielectric bridge structure has a first end contacting a sidewall of the dielectric pillar and a second end, opposite the first end, and contacting a sidewall of one of the suspended semiconductor channel material nanosheets.
Figure 10C:
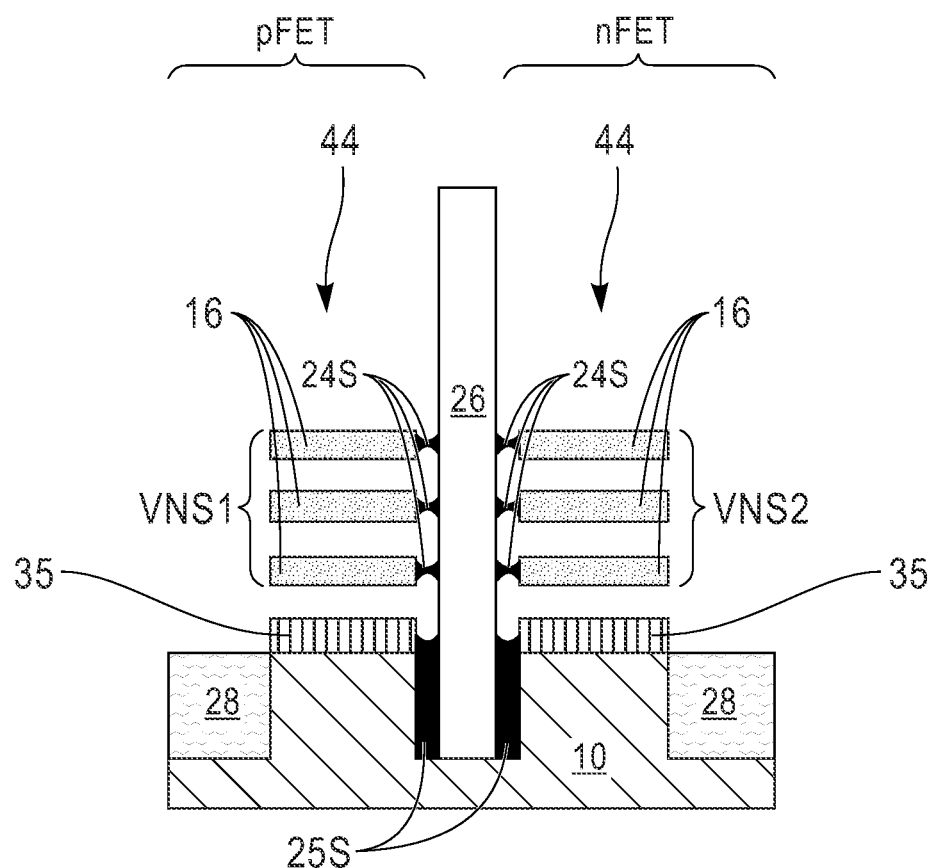
FIG. 10C is a cross sectional view of the exemplary structure of FIG. 9C after partial undercutting the dielectric spacer in accordance with one embodiment of the present application to provide a provide a plurality of horizontal dielectric bridge structures, wherein each horizontal dielectric bridge structure has a first end contacting a sidewall of the dielectric pillar and a second end, opposite the first end, and contacting a sidewall of one of the suspended semiconductor channel material nanosheets.

Referring now to FIGS. 10A, 10B and 10C, there are illustrated the exemplary structure of FIGS. 9A, 9B and 9C, respectively, after partial undercutting the dielectric spacer 24 in accordance with one embodiment of the present application to provide a provide a plurality of horizontal dielectric bridge structures 24S, wherein each horizontal dielectric bridge structure 34S has a first end contacting a sidewall of the dielectric pillar 26 and a second end, opposite the first end, and contacting a sidewall of one of the suspended semiconductor channel material nanosheets 16 of each of the first and second vertical nanosheet stacks, VNS1 and VNS2.

In this embodiment of the present application, the partially undercutting of the dielectric spacer 24 is performed utilizing an etchant such as, for example, dilute hydrofluoric (DHF) acid, that is selective in removing the dielectric spacer 25; the etch is timed so as to form the horizontal bridge structures 24S. The partially undercut leaves a remaining portion of the dielectric spacer 24 between each suspended semiconductor channel material nanosheet 16 and the first and second sidewalls of the dielectric pillar 24 so as to form the horizontal dielectric bridge structures 24S as shown in FIG. 10C. Each dielectric bridge structure 24S is thinner than the suspended semiconductor channel material nanosheets 16 of the first and second vertical nanosheet stacks, VNS1 and VNS2. Note that a dielectric spacer structure 25S remains surrounding a lower portion of the dielectric pillar 26 and that the dielectric spacer 25S is located between a portion of the semiconductor substrate 10 that is present in both the pFET device region and the nFET device region and the dielectric pillar 26. See, for example, FIG. 10C of the present application. Dielectric spacer structure 25S can have a topmost surface that is located beneath a topmost surface of the bottom dielectric isolation layer 35.

Figure 11B:
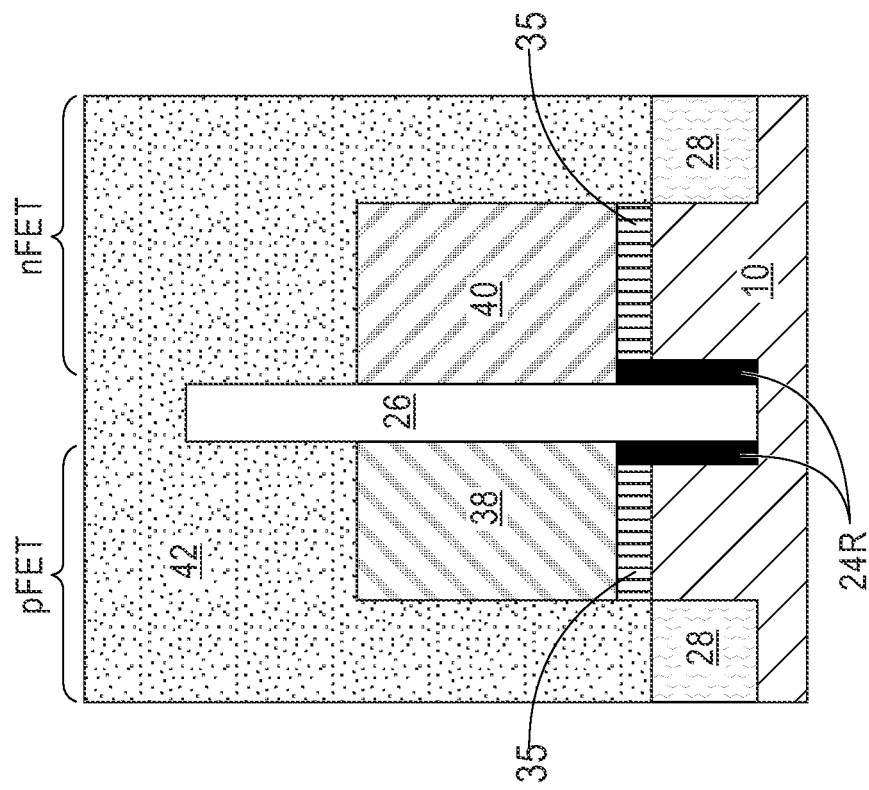
FIG. 11B is a cross sectional view of the exemplary structure of FIG. 10B after forming a functional gate structure around each suspended semiconductor channel material nanosheet.
Figure 11A:
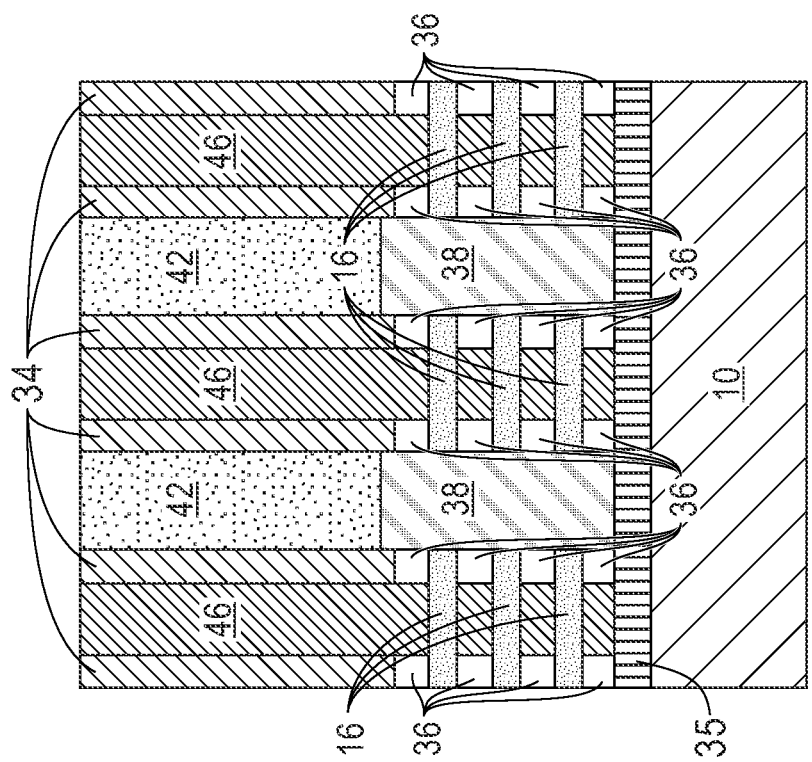
FIG. 11A is a cross sectional view of the exemplary structure of FIG. 10A after forming a functional gate structure around each suspended semiconductor channel material nanosheet.
Figure 11C:
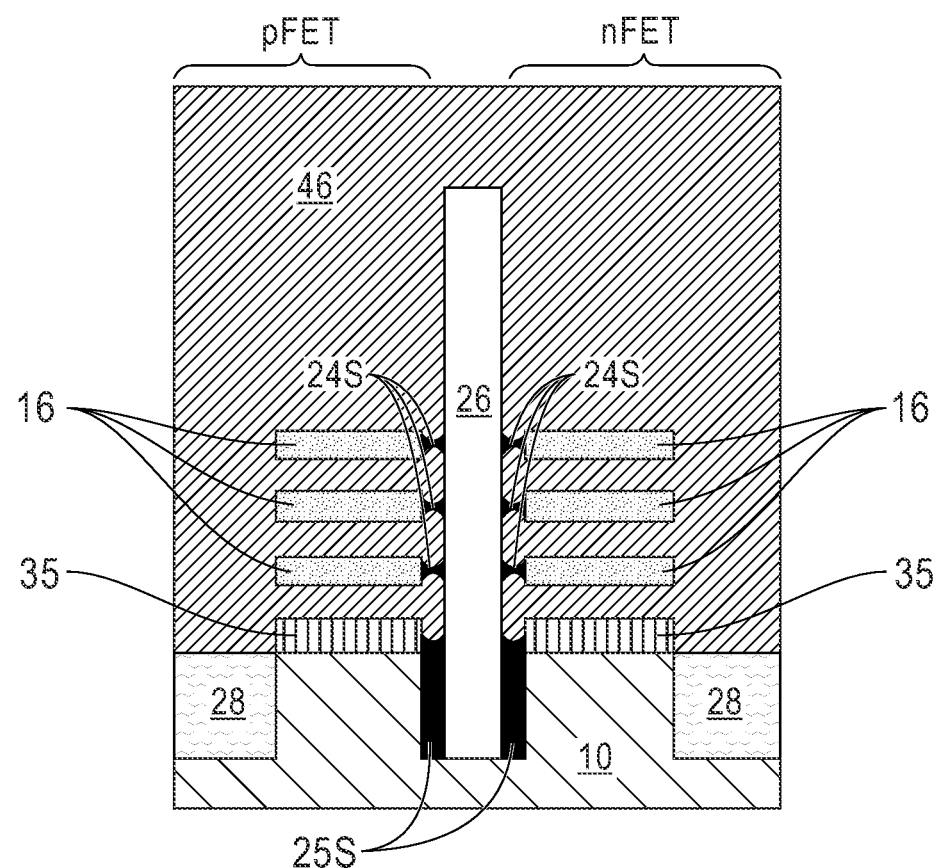
FIG. 11C is a cross sectional view of the exemplary structure of FIG. 11A after forming a functional gate structure around each suspended semiconductor channel material nanosheet.

Referring now to FIGS. 11A, 11B and 11C, there are illustrated the exemplary structure of FIGS. 10A, 10B and 10C, respectively, after forming a functional gate structure 46 around each suspended semiconductor channel material nanosheet 16 of the first and second vertical nanosheet stacks, VNS1 and VNS2. The functional gate structure 46 fills each gate cavity 44, is present laterally adjacent to, and above, the dielectric pillar 26, and contacts a top and bottom surface of each horizontal dielectric bridge structure 24S. The functional gate structure 46 is as shared functional gate structure meaning that the functional gate structure 46 is a single gate structure that is present in both the pFET device region and the nFET device region as is shown in FIG. 11C.

The functional gate structure 46 includes at least a gate dielectric material layer and a gate electrode; both of which are not individually shown in the drawings of the present application. The functional gate structure 46 wraps arounds each semiconductor channel material nanosheet 16 of each first and second vertical nanosheet stacks, VNS1 and VNS2, and is present above and below each horizontal dielectric bridge structure 24S. As is known, the gate dielectric material layer of the functional gate structure 46 is in direct contact with physically exposed portions of each semiconductor channel material nanosheet 16, and the gate electrode is located on the gate dielectric material layer. In some embodiments, the functional gate structure 44 includes a work function metal (WFM) layer located between the gate dielectric material layer and the gate electrode. In some embodiments (not shown), a gate cap is located above a recessed functional gate structure 46. In other embodiments, a gate cap is omitted.

The functional gate structure 46 includes forming a continuous layer of gate dielectric material and a gate electrode material inside and outside the gate cavity 44. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity 44.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity 44.

The remaining continuous layer of the gate dielectric material that is present inside the gate cavity 44 can be referred to as a gate dielectric material layer, the remaining optional layer of WFM that is present inside the gate cavity can be referred to a WFM layer, and remaining gate electrode material that is present inside the gate cavity 44 provides a gate electrode.

When present, gate cap can be composed of a hard mask material such as, for example, silicon dioxide or silicon nitride. The gate cap can be formed by a deposition process, followed by a planarization process.

FIGS. 11A, 11B and 11C illustrates a semiconductor structure (i.e., fork sheet device) of a first embodiment of the present application. Notably, the semiconductor structure includes a first vertical nanosheet stack (e.g., VNS1) of suspended semiconductor channel material nanosheets 16 located in a first device region (e.g., a pFET device region), and a second vertical nanosheet stack (e.g., VNS2) of suspended semiconductor channel material nanosheets 16 located in a second device region (e.g., an nFET region). The semiconductor structure further includes a dielectric pillar 26 located between the first vertical nanosheet stack (e.g., VNS1) of suspended semiconductor channel material nanosheets 16 and the second vertical nanosheet stack (e.g., VNS2) of suspended semiconductor channel material nanosheets 16, horizontal dielectric bridge structures 24S located in the first device region (e.g., the pFET device region), wherein each horizontal bridge structure 24S in the first device region (e.g., the pFET device region) has a first end contacting a first sidewall of the dielectric pillar 26 and a second end, opposite the first end, and contacting a sidewall of one of the suspended semiconductor channel material nanosheets 16 of the first vertical nanosheet stack (e.g., VNS1). The structure even further includes horizontal dielectric bridge structures 24S located in the second device region (e.g., the nFET device region), wherein each horizontal bridge structure 24S in the second device region (e.g., the nFET device region) has a first end contacting a second sidewall, opposite the first sidewall, of the dielectric pillar 26 and a second end, opposite the first end, and contacting a sidewall of one of the suspended semiconductor channel material nanosheets 16 of the second vertical nanosheet stack (e.g., VNS2).

Figure 12B:
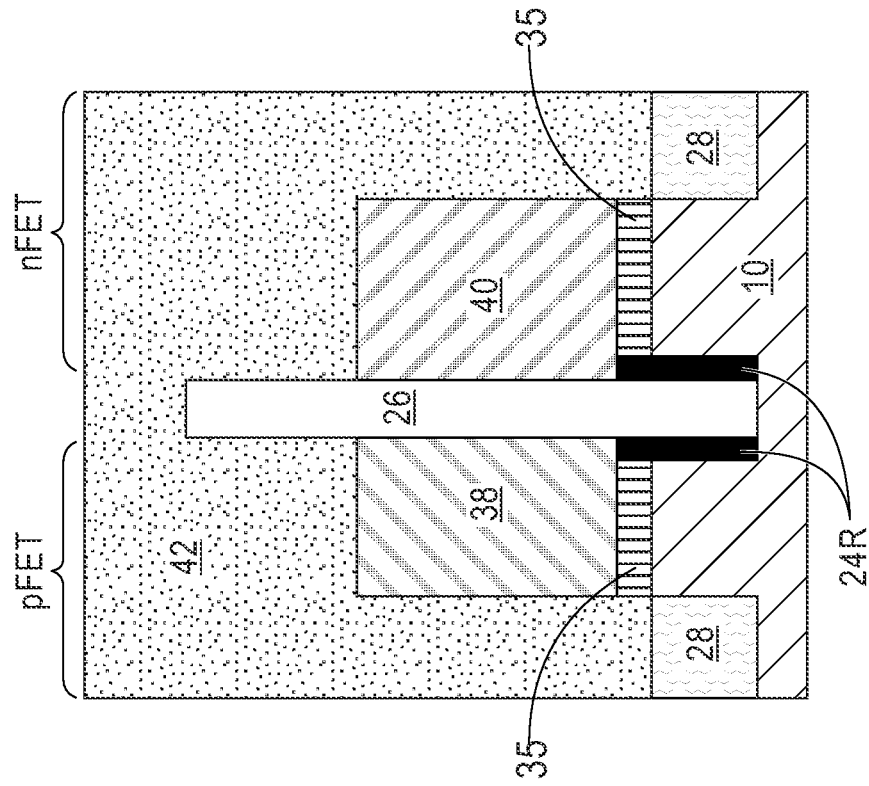
FIG. 12B is a cross sectional view of the exemplary structure of FIG. 9B after fully undercutting the dielectric spacer in accordance with another embodiment of the present application.
Figure 12A:
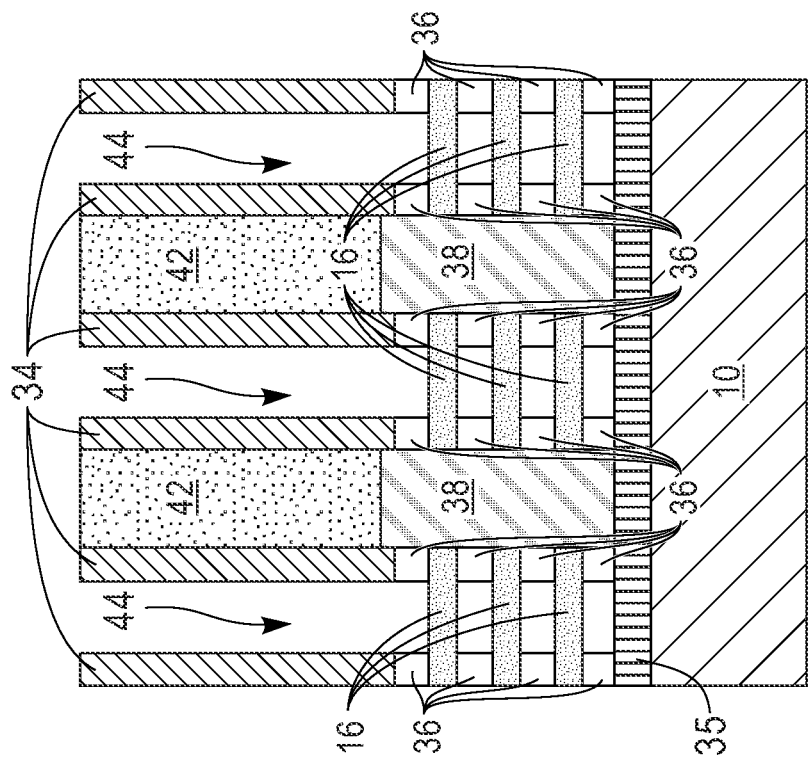
FIG. 12A is a cross sectional view of the exemplary structure of FIG. 9A after fully undercutting the dielectric spacer in accordance with another embodiment of the present application.
Figure 12C:
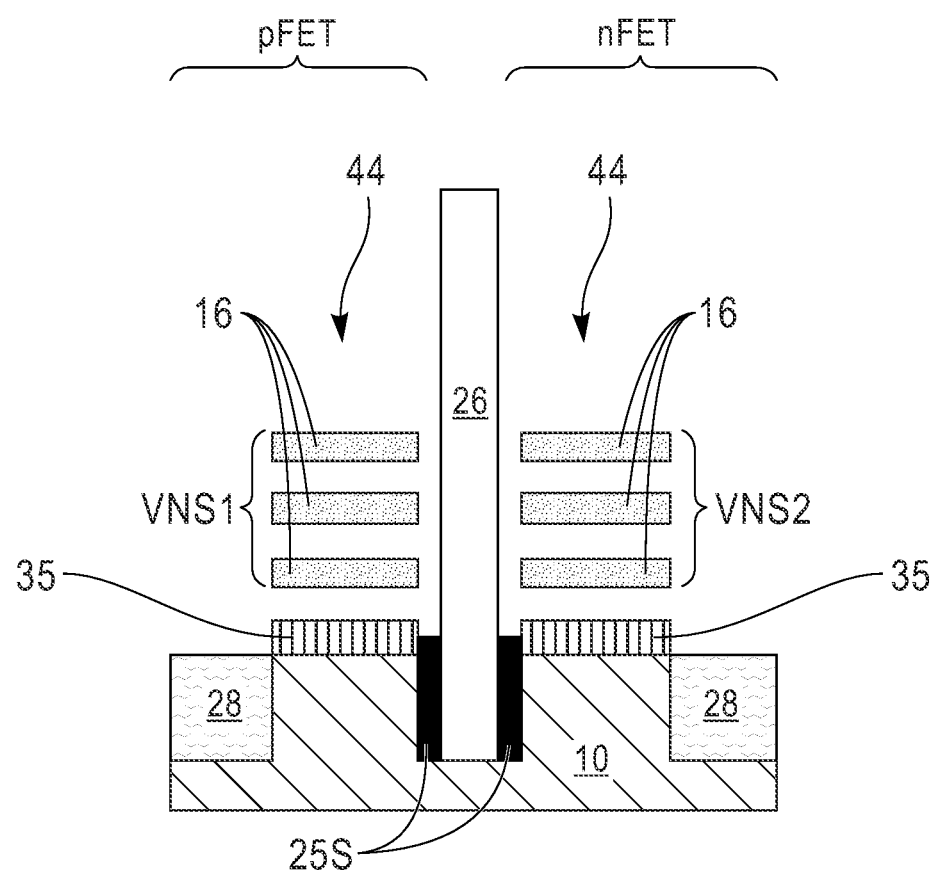
FIG. 12C is a cross sectional view of the exemplary structure of FIG. 9C after fully undercutting the dielectric spacer in accordance with another embodiment of the present application.

Referring now to FIGS. 12A, 12B and 12C, there are illustrated the exemplary structure of FIGS. 9A, 9B and 9C, respectively, after fully undercutting the dielectric spacer 24 in accordance with another embodiment of the present application. In this embodiment, no dielectric spacer 24 is left between the suspended semiconductor channel material nanosheets 16 and the first and second sidewalls of the dielectric pillar 26.

In this embodiment of the present application, the complete undercutting of the dielectric spacer 24 is also performed utilizing an etchant such as, for example, dilute hydrofluoric (DHF) acid, that is selective in removing the dielectric spacer 24; the etch is timed so to ensure complete removal of the dielectric spacer 24. The complete leaves no dielectric spacer 24 between each suspended semiconductor channel material nanosheet 16 and the first and second sidewalls of the dielectric pillar 24 so as to form exemplary structure shown in FIG. 12C. Note that a dielectric spacer structure 25S remains surrounding a lower portion of the dielectric pillar 26 and that the dielectric spacer 25S is located between a portion of the semiconductor substrate 10 that is present in both the pFET device region and the nFET device region and the dielectric pillar 26. See, for example, FIG. 12C of the present application. Dielectric spacer structure 25S can have a topmost surface that is located beneath a topmost surface of the bottom dielectric isolation layer 35.

Figure 13A:
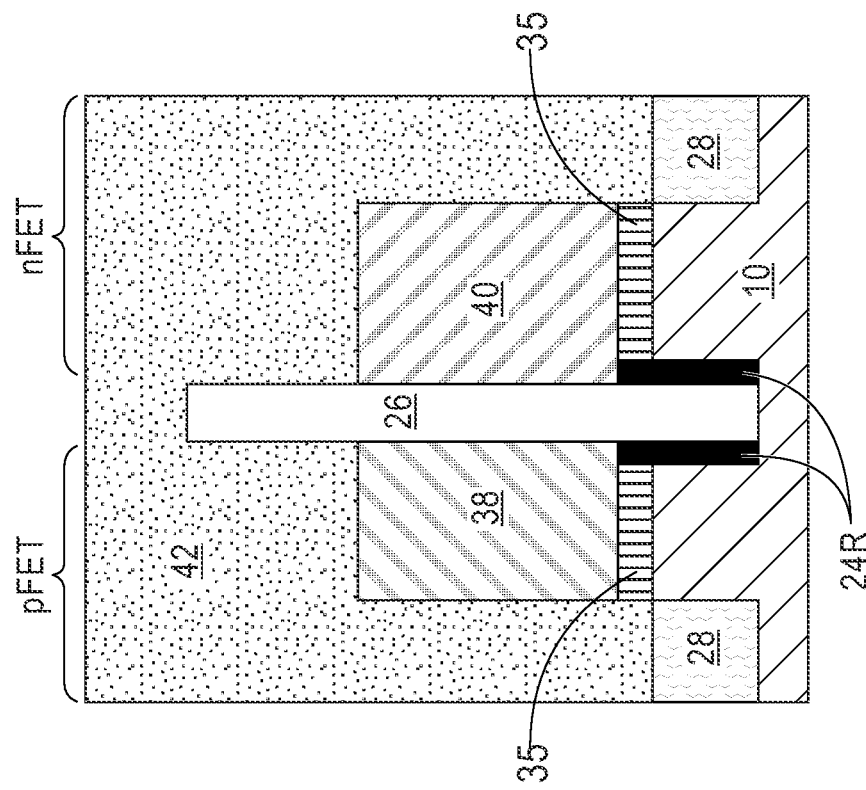
FIG. 13A is a cross sectional view of the exemplary structure of FIG. 12A after forming a functional gate structure around each suspended semiconductor channel material nanosheet.
Figure 13B:
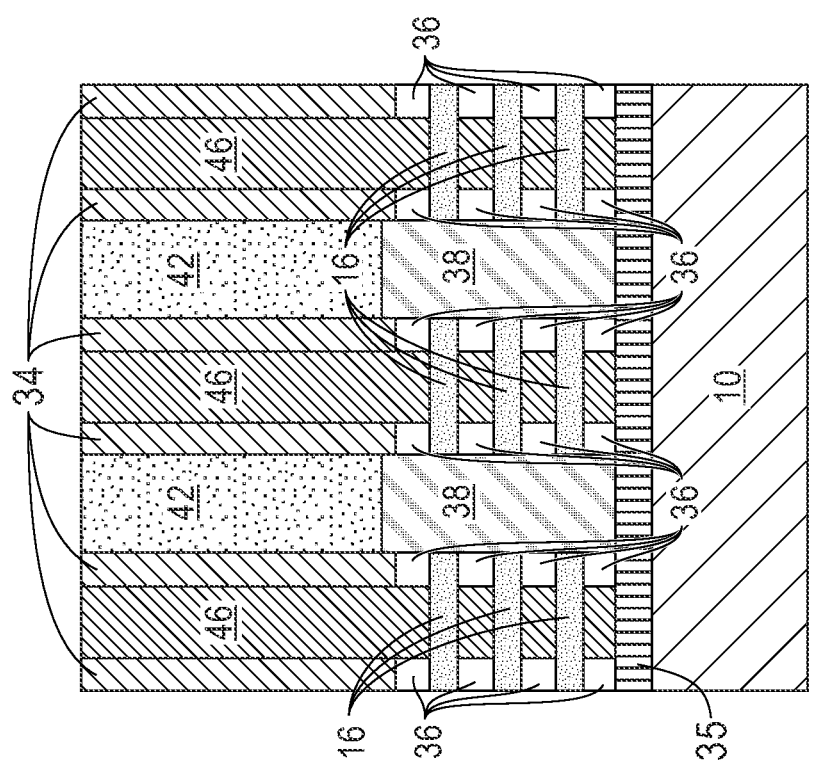
FIG. 13B is a cross sectional view of the exemplary structure of FIG. 12B after forming a functional gate structure around each suspended semiconductor channel material nanosheet.
Figure 13C:
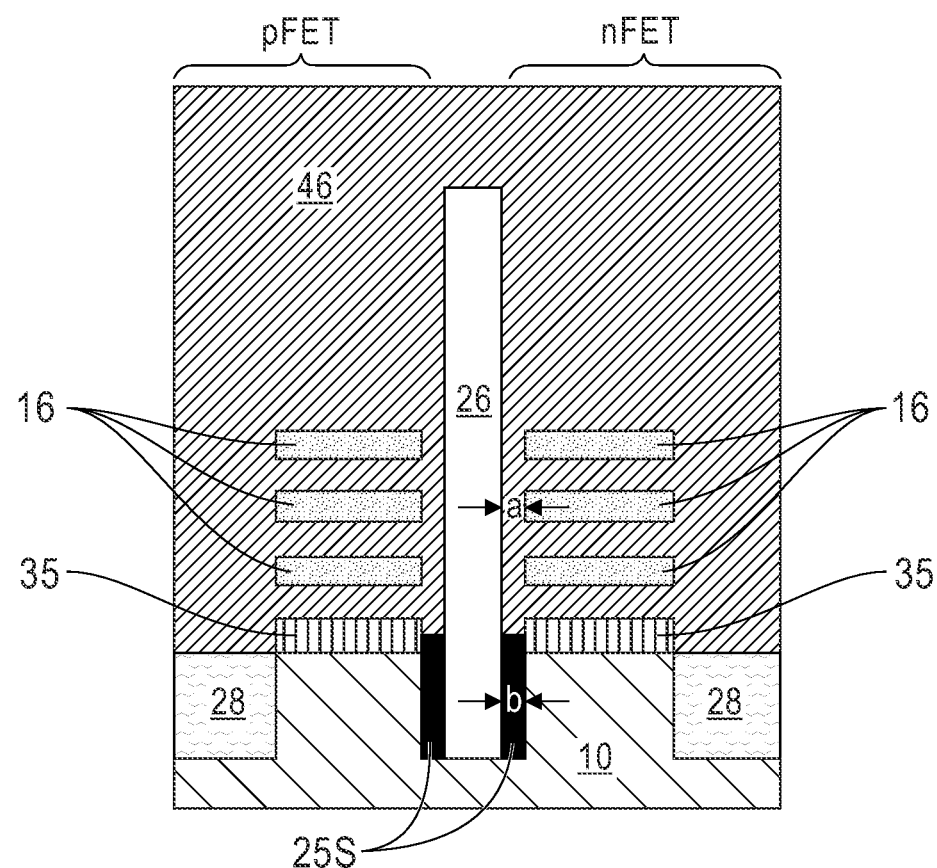
FIG. 13C is a cross sectional view of the exemplary structure of FIG. 12C after forming a functional gate structure around each suspended semiconductor channel material nanosheet.

Referring now to FIGS. 13A, 13B and 13C, there are illustrated the exemplary structure of FIGS. 12A, 12B and 1C, respectively after forming a functional gate structure 46 around each suspended semiconductor channel material nanosheet 16 of the first and second vertical nanosheet stacks, VNS1 and VNS2. The functional gate structure 46 of this embodiment is the same as the functional gate structure 46 mentioned above in the previous embodiment in which the exemplary structure shown in FIGS. 11A, 11B and 11C was formed. In FIG. 13C, the distance, a, between a sidewall of each suspended semiconductor channel material nanosheet 16 is the same as the width, b, of the dielectric spacer structure 25S (this width, b, is equal to the thickness of the original dielectric spacer 24.

FIGS. 13A, 13B and 13C illustrate a semiconductor structure (i.e., fork sheet device) in accordance with a second embodiment of the present application. Notably, and in the second embodiment, the semiconductor structure includes a first vertical nanosheet stack (e.g., VNS1) of suspended semiconductor channel material nanosheets 16 located in a first device region (e.g., a pFET device region), and a second vertical nanosheet stack (e.g., VNS2) of suspended semiconductor channel material nanosheets 16 located in a second device region (e.g., an nFET device region). The structure further includes a dielectric pillar 26 located between the first vertical nanosheet stack (e.g., VNS1) of suspended semiconductor channel material nanosheets 16 and the second vertical nanosheet stack (e.g., VNS2) of suspended semiconductor channel material nanosheets 16, and a dielectric spacer structure 25S laterally surrounding a lower portion of the dielectric pillar 26 and present in a semiconductor substrate 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first vertical nanosheet stack of suspended semiconductor channel material nanosheets located in a first device region;
   a second vertical nanosheet stack of suspended semiconductor channel material nanosheets located in a second device region;
   a dielectric pillar located between the first vertical nanosheet stack of suspended semiconductor channel material nanosheets and the second vertical nanosheet stack of suspended semiconductor channel material nanosheets, wherein the dielectric pillar extends beneath a topmost surface of a semiconductor substrate;
   horizontal dielectric bridge structures located in the first device region, wherein each horizontal bridge structure in the first device region has a first end contacting a first sidewall of the dielectric pillar and a second end, opposite the first end, and contacting a sidewall of one of the suspended semiconductor channel material nanosheets of the first vertical nanosheet stack; and
   horizontal dielectric bridge structures located in the second device region, wherein each horizontal bridge structure in the second device region has a first end contacting a second sidewall, opposite the first sidewall, of the dielectric pillar and a second end, opposite the first end, and contacting a sidewall of one of the suspended semiconductor channel material nanosheets of the second vertical nanosheet stack.

2. The semiconductor structure of claim 1, wherein the horizontal dielectric bridge structures located in the first device region are thinner than the suspended semiconductor channel material nanosheets of the first vertical nanosheet stack, and the horizontal dielectric bridge structures located in the second device region are thinner than the suspended semiconductor channel material nanosheets of the second vertical nanosheet stack.

3. The semiconductor structure of claim 1, wherein a dielectric spacer structure laterally surrounds a lower portion of the dielectric pillar and is present in the semiconductor substrate.

4. The semiconductor structure of claim 3, wherein the dielectric spacer structure is composed of a compositionally same dielectric material as the horizontal dielectric bridge structures.

5. The semiconductor structure of claim 1, further comprising a bottom dielectric isolation layer located in the first device region and beneath the first vertical nanosheet stack, and another bottom dielectric isolation layer located in the second device region and beneath the second vertical nanosheet stack.

6. The semiconductor structure of claim 5, wherein the bottom dielectric isolation layer and the another bottom dielectric isolation layer are present on a surface of the semiconductor substrate.

7. The semiconductor structure of claim 1, further comprising a functional gate structure present above and below each suspended semiconductor material nanosheet of the first vertical nanosheet stack of suspended semiconductor channel material nanosheets, and above and below each suspended semiconductor material nanosheet of the second vertical nanosheet stack of suspended semiconductor channel material nanosheets, wherein the functional gate structure is present above the dielectric pillar and contacts a top surface and a bottom surface of each of the dielectric bridge structures that are present in both the first device region and the second device region.

8. The semiconductor structure of claim 1, further comprising a first device source/drain region located in the first device region, and a second device source/drain region located in the second device region, wherein the first device source/drain region and the second device source/drain region are separated by the dielectric pillar.

9. The semiconductor structure of claim 8, further comprising a reduced height dielectric spacer located beneath each of the first device source/drain region and the second device source/drain region and laterally surrounding a lower portion of the dielectric pillar.

10. The semiconductor structure of claim 1, wherein the dielectric pillar has a height that extends above a height of the first vertical nanosheet stack of suspended semiconductor channel material nanosheets and a height of the second vertical nanosheet stack of suspended semiconductor channel material nanosheets.

11. A semiconductor structure comprising:
a first vertical nanosheet stack of suspended semiconductor channel material nanosheets located in a first device region;
a second vertical nanosheet stack of suspended semiconductor channel material nanosheets located in a second device region;
a dielectric pillar located between the first vertical nanosheet stack of suspended semiconductor channel material nanosheets and the second vertical nanosheet stack of suspended semiconductor channel material nanosheets;
horizontal dielectric bridge structures located in the first device region, wherein each horizontal bridge structure in the first device region has a first end contacting a first sidewall of the dielectric pillar and a second end, opposite the first end, and contacting a sidewall of one of the suspended semiconductor channel material nanosheets of the first vertical nanosheet stack;
horizontal dielectric bridge structures located in the second device region, wherein each horizontal bridge structure in the second device region has a first end contacting a second sidewall, opposite the first sidewall, of the dielectric pillar and a second end, opposite the first end, and contacting a sidewall of one of the suspended semiconductor channel material nanosheets of the second vertical nanosheet stack; and
a dielectric spacer structure laterally surrounding a lower portion of the dielectric pillar and present in a semiconductor substrate.

12. A semiconductor structure comprising:
a first vertical nanosheet stack of suspended semiconductor channel material nanosheets located in a first device region;
a second vertical nanosheet stack of suspended semiconductor channel material nanosheets located in a second device region;
a dielectric pillar located between the first vertical nanosheet stack of suspended semiconductor channel material nanosheets and the second vertical nanosheet stack of suspended semiconductor channel material nanosheets;
horizontal dielectric bridge structures located in the first device region, wherein each horizontal bridge structure in the first device region has a first end contacting a first sidewall of the dielectric pillar and a second end, opposite the first end, and contacting a sidewall of one of the suspended semiconductor channel material nanosheets of the first vertical nanosheet stack;
horizontal dielectric bridge structures located in the second device region, wherein each horizontal bridge structure in the second device region has a first end contacting a second sidewall, opposite the first sidewall, of the dielectric pillar and a second end, opposite the first end, and contacting a sidewall of one of the suspended semiconductor channel material nanosheets of the second vertical nanosheet stack;
a first device source/drain region located in the first device region, and a second device source/drain region located in the second device region, wherein the first device source/drain region and the second device source/drain region are separated by the dielectric pillar; and
a reduced height dielectric spacer located beneath each of the first device source/drain region and the second device source/drain region and laterally surrounding a lower portion of the dielectric pillar.

* * * * *